United States Patent

Kondo

[11] Patent Number: 5,658,708
[45] Date of Patent: Aug. 19, 1997

[54] IMAGE RECORDING MATERIAL

[75] Inventor: Syunichi Kondo, Shizuoka, Japan

[73] Assignee: Fuji Photo Film Co., Ltd., Minami-ashigara, Japan

[21] Appl. No.: 598,496

[22] Filed: Feb. 8, 1996

[30] Foreign Application Priority Data

Feb. 17, 1995 [JP] Japan ................ 7-029774
Feb. 23, 1995 [JP] Japan ................ 7-035493

[51] Int. Cl.$^6$ ............... G03F 7/004; G03F 7/028; B41C 1/05
[52] U.S. Cl. ......... 430/288.1; 430/944; 430/281.1; 430/945; 522/22; 522/25; 522/6; 522/2; 525/312
[58] Field of Search ............ 430/281.1, 944, 430/288.1; 522/22, 25, 6, 2; 525/312

[56] References Cited

U.S. PATENT DOCUMENTS

| | | | |
|---|---|---|---|
| 4,069,056 | 1/1978 | Crivello | 430/288.1 |
| 4,959,297 | 9/1990 | Palazzotto | 430/281.1 X |
| 5,008,175 | 4/1991 | Hsieh et al. | 430/270.1 X |
| 5,017,462 | 5/1991 | Stahlhofen | 430/270.1 X |
| 5,262,275 | 11/1993 | Fan | 430/944 X |
| 5,364,738 | 11/1994 | Kondo et al. | 430/281.1 X |
| 5,395,729 | 3/1995 | Reardon et al. | 430/200 |
| 5,491,046 | 2/1996 | DeBoer et al. | 430/944 X |
| 5,514,728 | 5/1996 | Lamanna et al. | 522/31 |

FOREIGN PATENT DOCUMENTS

| | | | |
|---|---|---|---|
| 0609684A1 | 8/1994 | European Pat. Off. | 430/302 |
| 4-330445A | 11/1992 | Japan | 430/281 |

*Primary Examiner*—Cynthia Hamilton
*Attorney, Agent, or Firm*—Burns, Doane, Swecker & Mathis, LLP

[57] ABSTRACT

An image recording material is disclosed, comprising a radiant ray-absorbing material, a compound having at least two enol ether groups represented by formula (I) and an alkali-soluble resin:

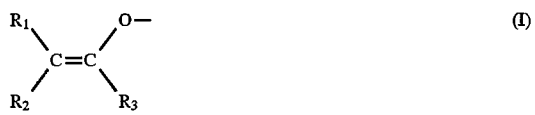

wherein $R_1$, $R_2$ and $R_3$ maybe the same or different, each represents a hydrogen atom, an alkyl group or an aryl group, or any two of them may form a saturated or unsaturated olefinic ring by combining with each other; and a method for preparing the above image recording material is disclosed.

5 Claims, No Drawings

IMAGE RECORDING MATERIAL

FIELD OF THE INVENTION

The present invention relates to an image recording material which can be used as an offset printing master and, more particularly, to a planographic printing plate suitable for the so-called direct plate-making, which enables the direct plate-making from digital signals of a computer or the like.

BACKGROUND OF THE INVENTION

Owing to the recent remarkable development in the art of laser, it has become possible to easily obtain miniature devices of high-output solid laser and semiconductor laser which have the emission region into the near infrared or infrared region. Such the laser devices are very useful as exposure sources upon direct plate-making from digital data of a computer or the like.

Conventionally, as a planographic printing plate of the type which enables direct drawing thereon from digital data of a computer, an electrophotographic system utilized-printing plate, a printing plate of the photopolymerization type which is exposed with argon or YAG laser beams and, if needed, post-heating in combination therewith, a printing plate laminating on a photosensitive resin layer a silver salt photosensitive material, a printing plate of the silver salt diffusion transfer type, and a printing plate of the type which a silicone rubber layer destroyed by an electric discharge or exposure to laser beams are known.

The electrophotographic system-utilized printing plate involves complicated processing operations, namely charging, exposure and development process, and so a large-sized complex apparatus is required. The printing plate of the photopolymerization type essentially has a sensitivity limit, and so it is difficult to apply a miniature laser device thereto and to handle it in a bright room. The printing plate having a layer of silver salt photosensitive material and the printing plate of the silver salt diffusion transfer type are complicated in processing operations and have high cost. The printing plate of the type which has a silicone rubber layer destructible by laser beams has a problem of removal of silicone sediment remaining on the plate surface.

As the art of enabling the image formation with those light sources, JP-A-52-113219 (the term "JP-A" as used herein means an "unexamined published Japanese patent application") discloses the positive working recording material which comprises a compound decomposable by light and heat (e.g., a diazonium compound), particles of a material capable of absorbing light and transforming the absorbed light into heat, and a binder. In addition, JP-A-58-148792 discloses the light- and heat-sensitive recording material which contains as main components particles of a thermoplastic resin, a light-to-heat transformation material and a photo-crosslinking material (e.g., diazonium compound).

However, the above-described recording materials which are usable laser beams as a light source have low sensitivity. In case of a direct plate-making system, the above-described positive working materials require a considerably long writing time since digital data of a computer or the like are directly written on the plate material by scanning the laser beams. With the intention of reducing the writing time, therefore, it has been expected to develop a highly sensitive material (if possible, of the negative working type) which enables the writing with a solid or semiconductor laser (heat mode) device having emission in the near infrared or infrared region.

Such being the case, conventional planographic printing plates which enable direct drawing from digital data of a computer were insufficient.

On the other hand, a vinyl ether group-containing compound is generally known as a species of polymerizing compound. The vinyl ether group-containing compound have been mainly developed as a cationic polymerizable compound. The cationic polymerization has characteristics, e.g., in that monomers can undergo polymerization without inhibition by oxygen and a contraction in volume is small on polymerization, as compared with radical polymerization. Accordingly, the combination of a vinyl ether group-containing compound with a photoacid generator, which can provide a UV curable resin, has been used for ink and coating materials, recently for the formation of a three dimensional pattern.

Examples of the compounds known as a photoacid generating agent (photocationic polymerization initiator) include diazonium salts, sulfonium salts, iodonium salts, pyrylium salts, thiopyrylium salts and so on. All the combinations of the aforesaid monomers for cationic polymerization with those photoacid generating agents are insufficient in sensitivity. On the other hand, photocationic polymerizable monomers having high sensitivity are described in Stephen C. Lapin, *Polymers Paint Colour Journal*, 179 (4237), 321 (1989).

Further, when the aforesaid monomers are combined, similarly to the above, with photoacid generating agents and the acid-hydrolyzable property of vinyl ether groups present therein is utilized, the resulting combinations can be used as positive working materials of the chemical amplification type, as recently disclosed in JP-A-06-230574 and JP-A-62-45971.

However, only exposure-light sources which can emit light of wavelengths of 450 nm or less can be employed since most of the photoacid generating agents, which are practically effective when used in the aforementioned art, absorb light at wavelengths of 450 nm or less.

SUMMARY OF THE INVENTION

An object of the present invention is to provide a negative or positive working image-recording material on which images can be recorded irrespective of the wavelengths of emission from an exposure-light source, and especially to provide a negative or positive working image-recording material on which images can be recorded with near infrared or infrared (heat rays) rays.

Another object of the present invention is to provide a method for preparing a negative or positive working image-recording material as described above.

A further object of the present invention is to provide a heat mode-writable planographic printing plate for the direct plate-making system, which enables the direct recording of digital data of computer origin or the like with a solid or semiconductor laser device (heat-mode) which has the emission region into the near infrared or infrared region, and to which conventional processors and printing apparatus can be applied as they are.

In order to attain the aforementioned objects, various image recording materials (to which another wording, photosensitive materials or photosensitive compositions, may occasionally be given, hereinafter) have been examined for thermal changes. As a result, it has been discovered that a coat film prepared by dissolving in a solvent a compound containing at least two enol ether groups and an alkali-soluble resin (a linear polymer having acid groups capable of thermally reacting with the enol ether groups) and applying the resulting solution to a support, followed by drying at a relatively low temperature, can effectively undergo a thermo-crosslinking reaction by heating at a high temperature to become insoluble in a solvent or alkaline aqueous solution, thereby achieving the present invention.

In another case where an acid precursor (photoacid generating agent) is further added to an image recording material as described above, it has been found that a coating film prepared by mixing a radiant ray-absorbing material (e.g., a carbon black dispersing agent) with a cation polymerizable liquid composition comprising an acid precursor (photoacid generating agent), a compound having at least two enol ether groups (e.g., vinyl ether groups), applying the resulting mixture to a support, and drying the applied mixture at a relatively low temperature (i.e., under the temperature condition in which the vinyl ether compound and binder in the mixture are not reacted) can be rendered insoluble in an alkaline aqueous solution (negative working) by irradiating YAG laser beams. When the applied mixture is dried at a high temperature (i.e., under the temperature condition in which the vinyl ether compound and binder in the mixture are reacted to form a crosslinked polymer), on the other hand, the coating film formed is insoluble in an alkaline developer in itself, but on the contrary, it becomes soluble therein (positive working) by irradiating YAG laser beams, thereby also achieving the present invention.

More specifically, the aforementioned objects of the present invention are attained with (1) an image recording material which comprises a radiant ray-absorbing material, a compound having at least two enol ether groups represented by formula (I) and an alkali-soluble resin (or a linear polymer having acid groups capable of thermally reacting with the enol ether groups):

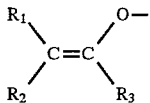
(I)

wherein $R_1$, $R_2$ and $R_3$ may be the same or different, each represents a hydrogen atom, an alkyl group or an aryl group, or any two of them may form a saturated or unsaturated olefinic ring by combining with each other.

Preferred embodiments of the present invention, (2) to (10), are described below:

(2) A negative working image-recording material, which can be used as a heat mode-writable, negative working, planographic printing plate suitable for the direct plate-making system; comprising a support having thereon a material capable of absorbing infrared or near infrared rays, a compound containing at least two enol ether groups represented by the foregoing formula (I) and a linear polymer containing acid groups.

(3) A negative working image-recording material which has on a support a layer comprising a material capable of absorbing infrared or near infrared rays, a compound containing at least two enol ether groups represented by the foregoing formula (I) and a linear polymer containing acid groups and hydroxyl groups.

(4) An image recording material according to the above embodiment (3), wherein the material capable of absorbing infrared or near infrared rays is a dye.

(5) An image recording material according to the aforementioned embodiment (3), wherein the material capable of absorbing infrared or near infrared rays is a pigment.

(6) An image recording material according to the aforementioned embodiment (3), wherein the material capable of absorbing infrared or near infrared rays is carbon black.

(7) An image recording material according to the aforementioned embodiment (3), wherein the support is a polyester film.

(8) An image recording material according to the aforementioned embodiment (3), wherein the support is an aluminum plate.

(9) A method for recording negative images wherein a negative working image-recording material, which has on a support a layer comprising a material capable of absorbing infrared or near infrared rays, a compound containing at least two enol ether groups represented by the foregoing formula (I) and a linear polymer containing acid groups and hydroxyl groups, is exposed by means of a laser device emitting near infrared or infrared rays and then developed with alkaline water.

(10) A negative working image-recording material according to the aforementioned embodiment (3), which is suitable for a negative working heat-sensitive planographic printing plate.

Further, preferably, the image recording material of the present invention is (1') an image recording material comprising a radiant ray-absorbing material; an acid precursor, a compound containing at least two enol ether groups represented by formula (I) and an alkali-soluble resin:

wherein $R_1$, $R_2$, and $R_3$ may be the same or different, each represents a hydrogen atom, an alkyl group or an aryl group, or any two of them may form a saturated or unsaturated olefinic ring by combining with each other.

Preferred embodiments of the present invention, (2') to (10') are described below:

(2') An image recording material, which can be used as a heat mode-writable planographic printing plate suitable for the direct plate-making system, comprising a support having thereon a material capable of absorbing infrared or near infrared rays, an acid precursor, a compound containing at least two enol ether groups represented by the foregoing formula (I) and an alkali-soluble resin.

(3') An image recording material which has on a support a layer comprising a material capable of absorbing infrared or near infrared rays, an acid precursor, a compound containing at least two enol ether groups represented by the foregoing formula (I) and an alkali-soluble resin.

(4') An image recording material according to the above embodiment (3'), wherein the material capable of absorbing infrared or near infrared rays is a dye.

(5') An image recording material according to the aforementioned embodiment (3'), wherein the material capable of absorbing infrared or near infrared rays is a pigment.

(6') An image recording material according to the aforementioned embodiment (3'), wherein the material capable of absorbing infrared or near infrared rays is carbon black.

(7') An image recording material according to the aforementioned embodiment (3'), wherein the support is a polyester film.

(8') An image recording material according to the aforementioned embodiment (3'), wherein the support is an aluminum plate.

(9') A method for recording images wherein an image recording material, which has on a support a layer comprising a material capable of absorbing infrared or near infrared rays, an acid precursor, a compound containing at least two enol ether groups represented by the foregoing formula (I)

and an alkali-soluble resin, is exposed by means of a laser device emitting near infrared or infrared rays and then developed with alkaline water.

(10') An image recording material according to the aforementioned embodiment (3'), which is suitable for a heat-sensitive planographic printing plate.

In accordance with the present invention, an image (especially a negative image) is formed by thermally cross-linking an acid group-containing linear polymer with a compound containing at least two enol ether groups by taking advantage of the thermal energy gained by absorption of radiant ray. The linear polymer used in the present invention is required, at least, to have acid groups. In addition to acid groups, hydroxyl groups may be present in the linear polymer.

Further, when an acid precursor is added to the foregoing ingredients, the image recording material according to the present invention becomes a negative or positive working photosensitive material depending on what condition is chosen for the formation of a photosensitive coating film. In the negative working case, thermal energy in which the radiant ray-absorbing material has gained by absorbing radiant ray is used for decomposition of the acid precursor to cause generation of acid. As a result, the cationic polymerization of the enol ether group-containing compound proceeds to form a negative image. In the positive working case, on the other hand, the thermo-crosslinking takes place between the enol ether group-containing compound and the acid group-containing binder (alkali-soluble resin) upon formation of the coating film under a high temperature condition, thereby rendering the coating film insoluble in alkaline water. When this coating film absorbs radiant ray in some area thereof, the acid precursor present in that area is decomposed to generate an acid, and the acid causes hydrolysis to render the ray-absorbed area soluble in alkaline water. Thus, a positive image is formed.

Accordingly, when the radiant ray is infrared or near infrared rays, the recording can be effectively made in a heat mode.

When the material capable of absorbing infrared or near infrared rays is a dye, the developability after exposure becomes satisfactory, while when a pigment is used as such a material, improved sensitivity can be obtained. In particular, carbon black is favorable because it shows the absorption of ray in a wide wavelength region and has high sensitivity.

As the support used in the present invention, a polyester film is favorable because it is lightweight and provides a transparent image, while an aluminum sheet is superior in dimensional stability and durability.

As the recording method applicable to the image recording materials of the present invention, it is preferable to adopt a method in which the exposure is carried out using a laser device which can emit infrared or near infrared rays and followed by the development with alkaline water.

When the image recording material according to the present invention is a planographic printing plate, it is preferable for the printing plate to enable the writing in heat mode and be suitable for the direct platemaking system.

The expression "writing in heat mode" as used herein signifies that the recording in an image recording material is carried out by means of an appropriate heat-ray source from which heat rays are emitted under the control of digital data. As the heat-ray source which can be used therein, facsimile, a thermal head used in a facsimile, a heat-sensitive copying machine or the like and an infrared or near infrared emitting laser device are exemplified. When the direct platemaking method is applied thereto, it is preferable to use an infrared or near infrared emitting laser device.

The light (e.g., ray) suitable for the present invention includes near infrared rays and infrared rays. As the infrared rays are generally called heat rays, the present invention can be said to be sensitive to heat when the recording in the present invention is performed with infrared rays.

DETAILED DESCRIPTION OF THE INVENTION

The radiant ray-absorbing material used in the present invention is a material of the type which generates heat upon absorption of light (radiant light). Examples of the material of this type include pigments and dyes.

Examples of pigments which can be used include commercially available pigments and the pigments recorded in books, e.g., *Handbook of Color Index (C.I.)*; *Saishin Ganryo Binran* (which means "Handbook of Newest Pigments"), edited by Nippon Ganryo Gijutsu Kyokai in 1977; *Saishin Ganryo Oyo Gijutsu* (which means "The Latest Application Technique of Pigments"), published by CMC in 1986; and *Insatsu Ink Gijutsu* (which means "Technique of Printing Ink"), published by CMC in 1984.

Examples of usable pigments include black pigments (e.g., carbon black), yellow pigments, orange pigments, brown pigments, red pigments, violet pigments, blue pigments, green pigments, fluorescent pigments and polymer-attached dyes. Specific examples of such pigments include insoluble diazo pigments, azo lake pigments, condensed azo pigments, chelated azo pigments, phthalocyanine pigments, anthraquinone pigments, perylene and perlrnone pigments, thioindigo pigments, quinacridone pigments, dioxazine pigments, isoindolinone pigments, quinophthalone pigments, dyed lake pigments, azine pigments, nitroso pigments, niyro pigments, natural pigments, fluorescent pigments, inorganic pigments, carbon black and so on.

These pigments may be used without surface treatment, or they may be used after surface treatment. As examples of a method of surface treatment which can be adopted therein, mention may be made of the method of coating a pigment surface with a resin or wax, the method of making a surfactant adhere to a pigment surface, the method of bonding a reactive substance (e.g., a silane coupling agent, an epoxy compound, a polyisocyanate) to a pigment surface, and so on. The methods as cited above are described, e.g., in *Kinzoku Sekken no Seishitsu to Oyo* (which means "Properties of Metal Soaps and Application thereof"), published by Koh Shoboh; *Insatsu Ink Gijutsu* (which means "Art of Printing Ink"), published by CMC in 1984; and *Saishin Ganryo Oyo Gijutsu* (which means "The Latest Application Technique of Pigments"), published by CMC in 1986.

The grain size of such a pigment is desirably from 0.01 to 10 μm, preferably from 0.05 to 1 μm. In dispersing pigment grains, known dispersion techniques used for preparation of ink, toner and the like can be adopted. Suitable examples of a dispersing apparatus which can be used in the present invention include a ultrasonic disperser, a sand mill; an attriter, a pearl mill; a super mill, a ball mill, an impeller, a disperser, a Kady mill, a colloid mill, a dynatron, a three-rod roll mill, a pressure kneader and so on. For details of the dispersion techniques *Saishin Ganryo Oyo Gijutsu* (which means "The Latest Application Technique of Pigments"), published by CMC in 1986, can be referred to.

As the dyes, on the other hand, commercially available dyes and known dyes as described in literatures (e.g., *Senryo*

*Binran* (which means "Handbook of Dyes"), compiled by Yuki Gosei Kagaku Kyokai in 1970) can be employed. Specific examples of such dyes include azo dyes, metal-complexed azo dyes, pyrazolone azo dyes, anthraquinone dyes, phthalocyanine dyes, carbonium dyes, quinoneimine dyes, methine dyes, cyanine dyes and so on.

Of those pigments and dyes, infrared- or near infrared-absorbing pigments and dyes are particularly favorable.

As the pigments capable of absorbing infrared or near infrared rays, carbon black is preferred over the others.

Examples of a dye capable of absorbing infrared or near infrared rays include the cyanine dyes as described, e.g., in JP-A-58-125246, JP-A-59-84356, JP-A-59-202829 and JP-A-60-78787, the methine dyes as described, e.g., in JP-A-8-173696, JP-A-58-181690 and JP-A-58-194595, the naphthoquinone dyes as described, e.g., in JP-A-58-112793, JP-A-58-224793, JP-A-59-48187, JP-A-59-73996, JP-A-60-52940 and JP-A-60-63744, the squarylium dyes as described in JP-A- 58-112792, and the cyanine dyes as described in British Patent 434,875.

Also, the near infrared absorbers described in U.S. Pat. No. 5,156,938 are used to advantage.

Further, the substituted arylbenzo(thio)pyrylium salts described in U.S. Pat. No. 3,881,924, the trimethinethiapyrylium salts described in JP-A-57-142645 (corresponding to U.S. Pat. No. 4,327,169), the pyrylium compounds described in JP-A-58-181051, JP-A-58-220143, JP-A-59-41363, JP-A-59-41363, JP-A-59-84248, JP-A-59-84249, JP-A-59-146063 and JP-A-59-146061, the cyanine dyes described in JP-A-59-216146, the pentamethinethiopyrylium salts and so on described in U.S. Pat. No. 4,283,475, and the pyrylium compounds disclosed in JP-B-05-13514 and JP-B-05-19702 (the term "JP-B" as used herein means an "examined Japanese patent publication) are used to particular advantage.

As other especially preferable examples of a near infrared absorbent, the near infrared absorbing dyes represented by formulae (I) and (II) in U.S. Pat. No. 4,756,993 may be used.

Those pigments or dyes can be added to an image recording material in a proportion of from 0.01 to 50 weight preferably from 0.1 to 20 weight %, and more preferably from 0.5 to 15 weight %, to the total solid components in the image recording material. When the proportion of pigments or dyes is less than 0.01 weight %, an image cannot be obtained; while scum is generated in the non-image area upon printing when the proportion is more than 50 weight %.

Next, the compound containing at least two enol ether groups represented by formula (I), which is another constituent of the image recording materials of the present invention, is explained in detail. Additionally, a compound containing only one enol ether group cannot bring about a crosslinking reaction, and so it cannot effectively produce the effects of the present invention.

When $R_1$, $R_2$ and $R_3$ in the enol ether group of formula (I) are aryl groups, each aryl group generally has 4 to 20 carbon atoms and may contain as a substituent group an alkyl group, an aryl group, an alkoxy group, an aryloxy group, an acyl group, an acyloxy group, an alkylmercapto group, an aminoacyl group, a carboalkoxy group, a nitro group, a sulfonyl group, a cyano group or a halogen atom.

When $R_1$, $R_2$ and $R_3$ each represent an alkyl group, the alkyl group is a saturated or unsaturated straight-chain, branched or alicyclic alkyl group having 1 to 20 carbon atoms and may contain as a substituent group a halogen atom, a cyano group, an ester group, a hydroxy group, an alkoxy group, an aryloxy group or an aryl group.

When any two among $R_1$, $R_2$ and $R_3$ combine with each other to form a saturated or olefinic unsaturated ring, e.g., a cycloalkyl or cycloalkenyl group, a member of the ring formed is generally from 3 to 8 atoms, preferably 5 or 6 atoms.

Of the enol ether groups represented by formula (I), the enol ether groups in which one among $R_1$, $R_2$ and $R_3$ is a methyl or ethyl group and the remainder are hydrogen atoms are favored over the others. In particular, the enol ether group in which $R_1$, $R_2$ and $R_3$ are all hydrogen atoms, namely vinyl ether group, is preferable.

Various compounds containing at least two enol ether groups, which can be used in the present invention, have boiling points of not less than 60° C. under atmospheric pressure. Suitable examples of a compound containing at least two vinyl ether groups include vinyl ether compounds represented by formulae (II) and (III):

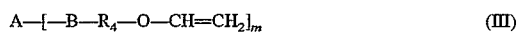

wherein A is a m-valent alkyl having 1 to 20 carbon atoms, aryl or heterocyclic group having 1 to 40 carbon atoms; B is —COO—, —NHCOO— or —NHCONH—; $R_4$ is a straight-chain or branched alkylene group having 1 to 10 carbon atoms; n is 0 or an integer of from 1 to 10; and m is an integer of from 2 to 10 (preferably from 2 to 6).

The compounds represented by formula (II) can be synthesized using the methods described, e.g., in Stephen C. Lapin, *Polymers Paint Colour Journal*, 179(4237), 321 (1988), specifically the reaction of a polyhydric alcohol or phenol with acetylene or the reaction of a polyhydric alcohol or phenol with a halogenoalkyl vinyl ether.

Specific examples of a vinyl ether compound represented by formula (II) include ethylene glycol divinyl ether, triethylene glycol divinyl ether, 1,3-butanediol divinyl ether, tetramethylene glycol divinyl ether, neopentyl glycol divinyl ether, trimethylolpropane trivinyl ether, trimethylolethane trivinyl, ether, hexanediol divinyl ether, 1,4-cyclohexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylenevinyl ether, pentaerythritol triethylene vinyl ether, pentaerythritol tetraethylene vinyl ether, 1,2-di (vinylethermethoxy)benzene, 1,2-di(vinyletherethoxy) benzene and the compounds of formulae (II-1) to (II-41) illustrated below. However, the compounds of formula (II) which can be used in the present invention should not be construed as being limited to those examples.

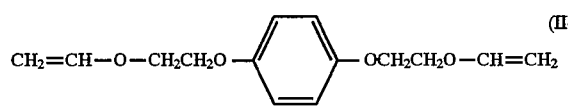 (II-1)
 (II-2)
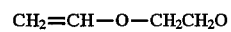 (II-3)
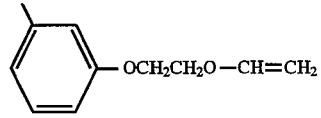
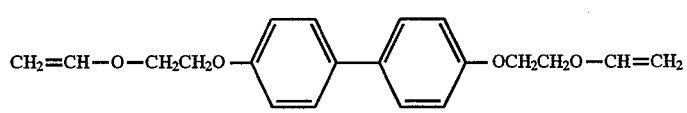 (II-4)
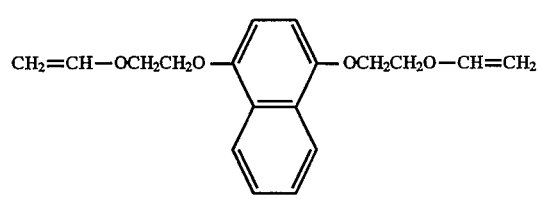 (II-5)
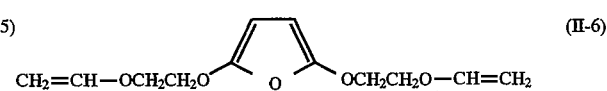 (II-6)
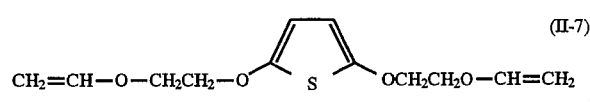 (II-7)
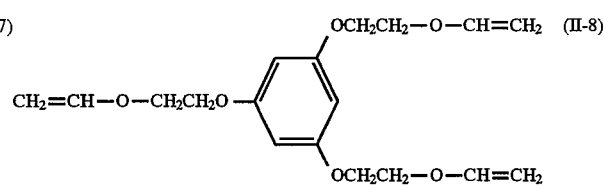 (II-8)
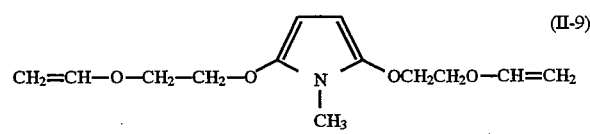 (II-9)
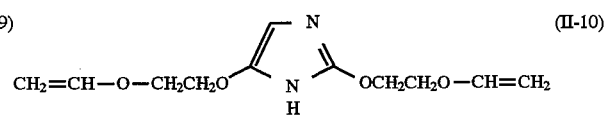 (II-10)
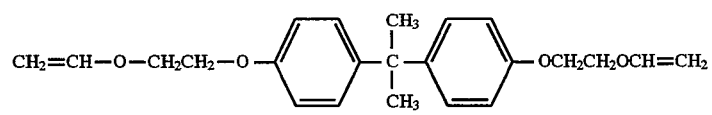 (II-11)
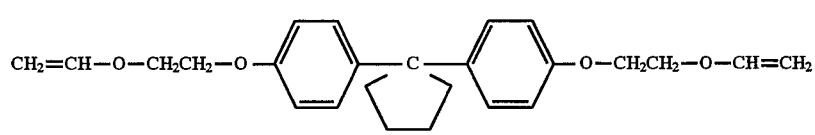 (II-12)
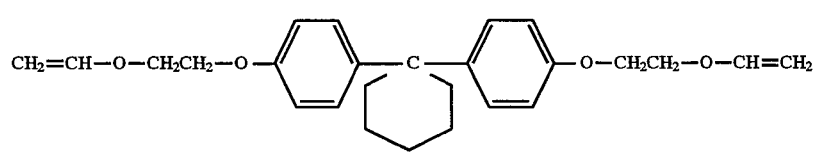 (II-13)
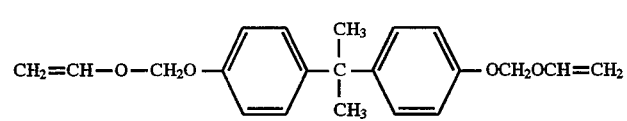 (II-14)
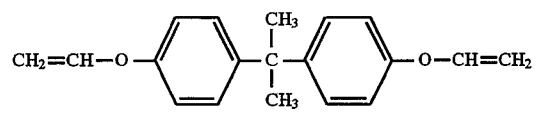 (II-15)
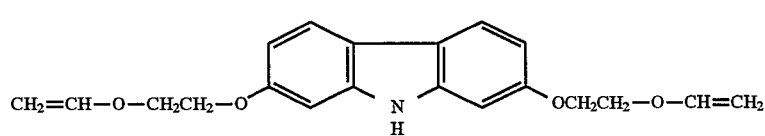 (II-16)

-continued
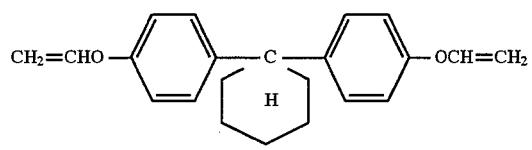 (II-17)
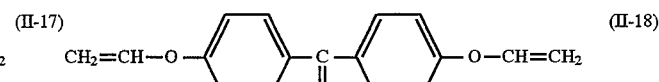 (II-18)
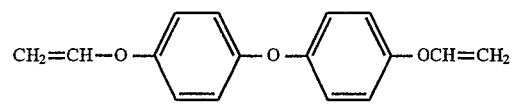 (II-19)
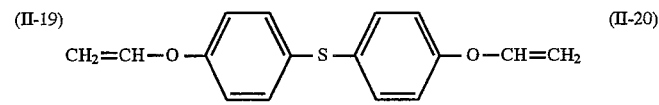 (II-20)
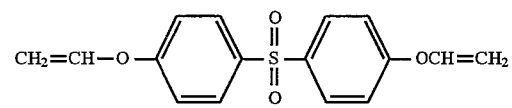 (II-21)
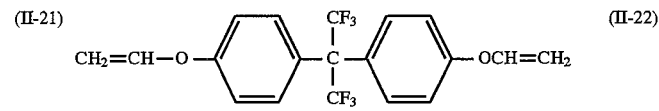 (II-22)
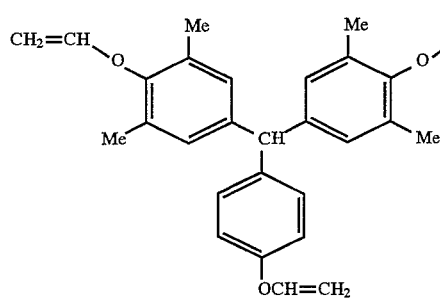 (II-23)
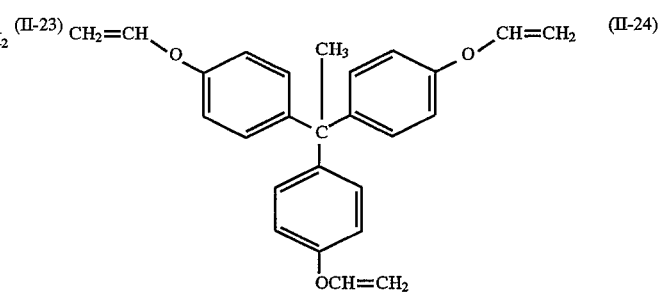 (II-24)
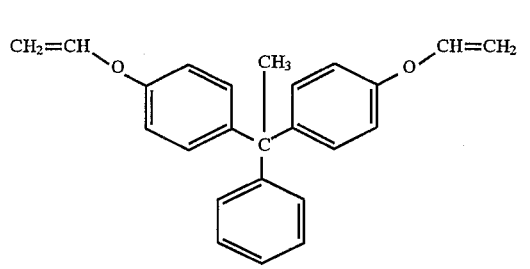 (II-25)
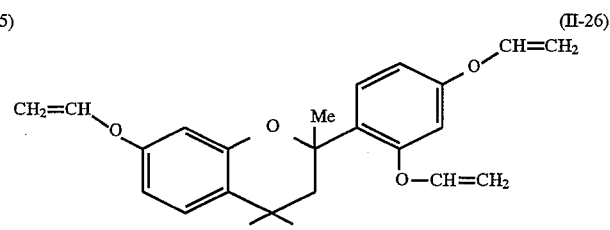 (II-26)
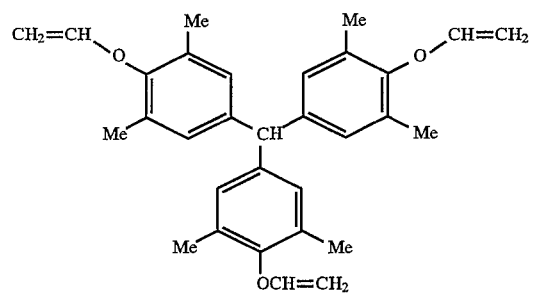 (II-27)
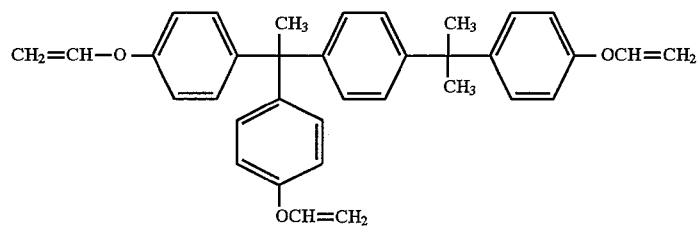 (II-28)

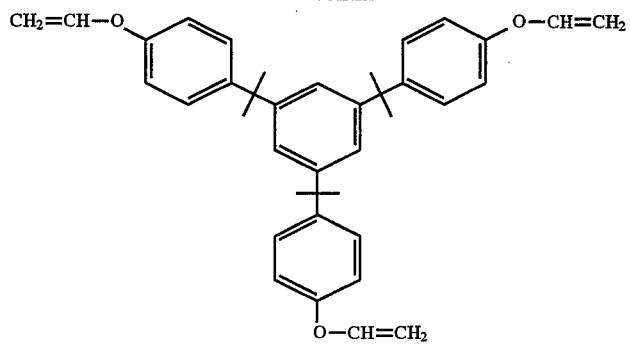 (II-29)
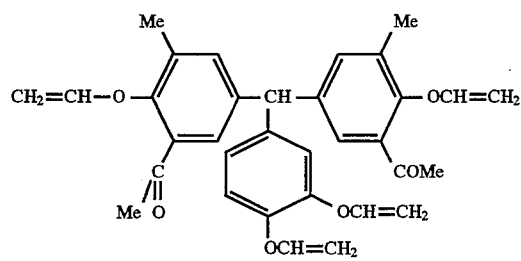 (II-30)
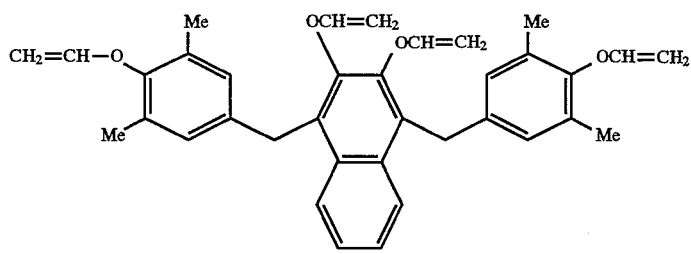 (II-31)
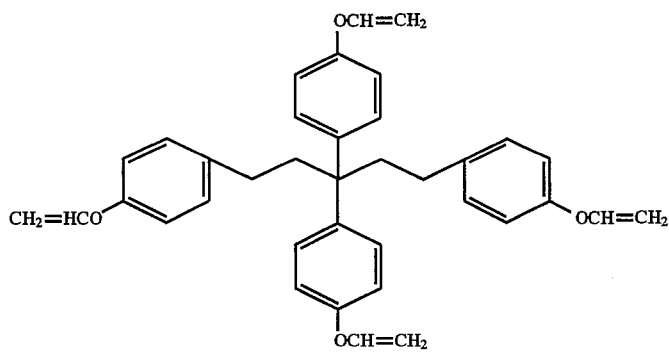 (II-32)
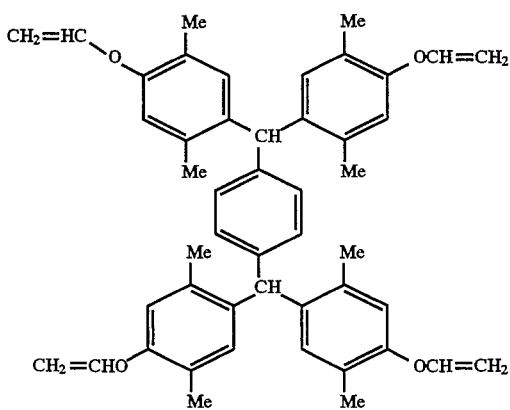 (II-33)
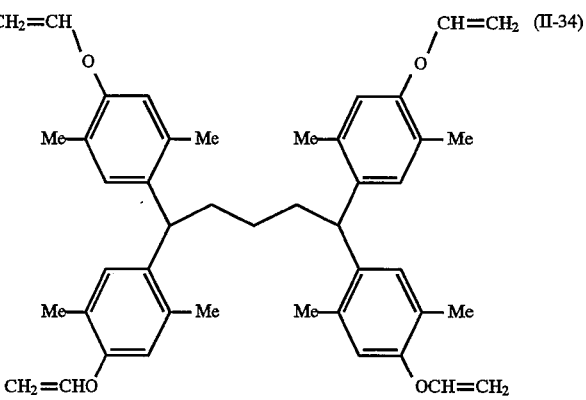 (II-34)

-continued

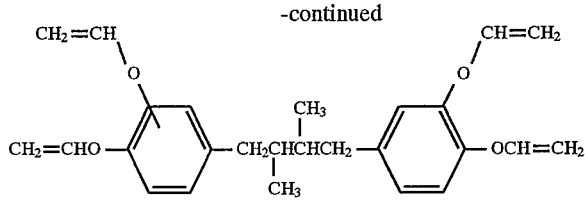 (II-35)

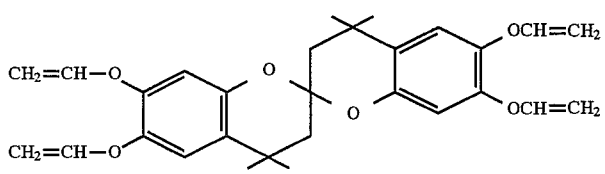 (II-36)

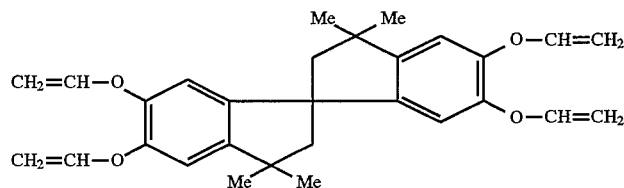 (II-37)

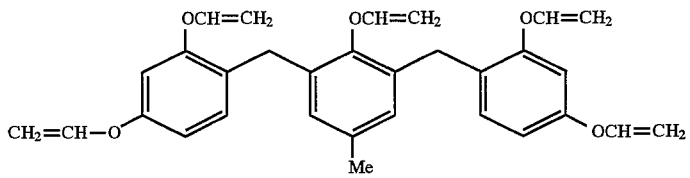 (II-38)

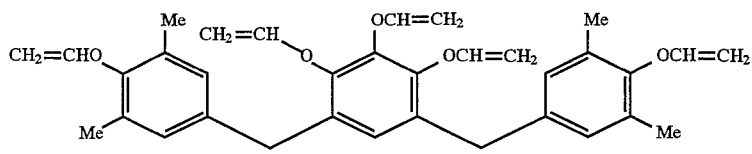 (II-39)

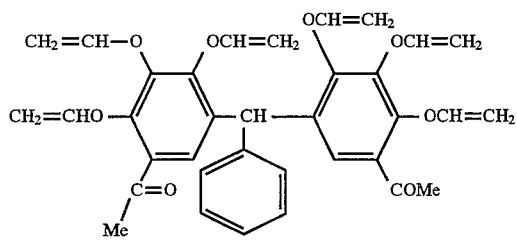 (II-40)

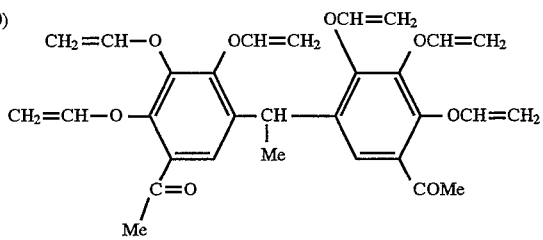 (II-41)

Of the compounds represented by formula (III), those having the linkage —COO— as B can be prepared by the reaction of a polycarboxylic acid with a halogenoalkyl vinyl ether.

Specific examples of such a compound include terephthalic acid diethylene vinyl ether, phthalic acid diethylene vinyl ether, isophthalic acid diethylene vinyl ether, phthalic acid dipropylene vinyl ether, terephthalic acid dipropylene vinyl ether, isophthalic acid dipropylene vinyl ether, maleic acid diethylene vinyl ether, fumaric acid diethylene vinyl ether, itaconic acid diethylene vinyl ether, and so on. However, the compounds of formula (III) which can be used in the present invention should not be construed as being limited to those examples.

Other examples of an enol ether group-containing compound which are preferably used for the present invention include the enol ether group-containing compounds prepared by the reaction of active hydrogen-containing enol ether compounds represented by formula (IV), (V) or (VI) with isocyanate group-containing compounds:

$$CH_2=CH-X-R_5-OH \qquad (IV)$$

$$CH_2=CH-X-R_5-COOH \qquad (V)$$

$$CH_2=CH-X-R_5-NH \qquad (VI)$$

wherein $R_5$ is a straight-chain or branched alkylene group having 1 to 10 carbon atoms (preferably 1 to 6 carbon atoms), and X is an oxygen or sulfur atom. As for the isocyanate group-containing compound which can be used in the aforementioned reaction, the compounds described, e.g., in Kakyozai Handbook (which means "Handbook of Crosslinking Agents), published by Taiseisha in 1981, can be used.

Specific examples of such the compounds include polyisocyanate compounds such as triphenylmethane-triisocyanate, diphenylmethanediisocyanate, tolylenediisocyanate, dimer of 2,4-tolylenedisocyanate, naphthalene-1,5-diisocyanate, o-tolylenediisocyanate, polymethylenepolyphenylisocyanate, hexamethylenediisocyanate, etc.; and polyisocyanate adducts such as tolylenediisocyanate-trimethylolpropane adducts, hexamethylenediisocyanate-water adducts, xylenediisocyanate-trimethylolpropane adducts, etc.

Various compounds which have enol ether groups at the molecular chain ends can be produced by reacting the above-cited isocyanate group-containing compounds with compounds in which both active hydrogen(s) and an enol ether group are present.

Specific examples of enol ether group-containing compounds which can be produced by the aforementioned reaction are illustrated below, but the scope of the present invention should not be construed as being limited by these examples:

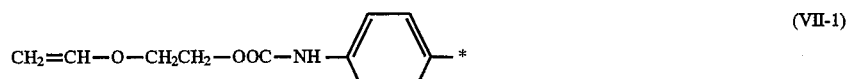
(VII-1)

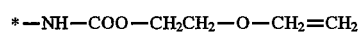

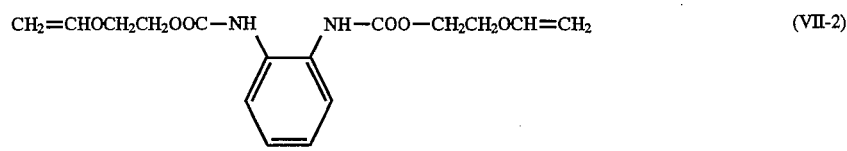
(VII-2)

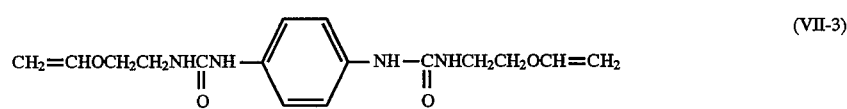
(VII-3)

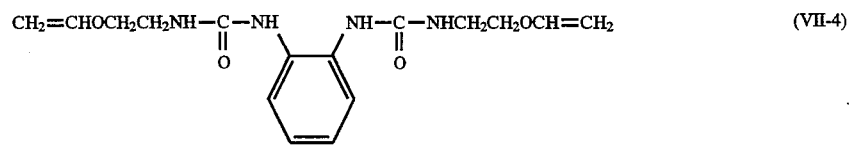
(VII-4)

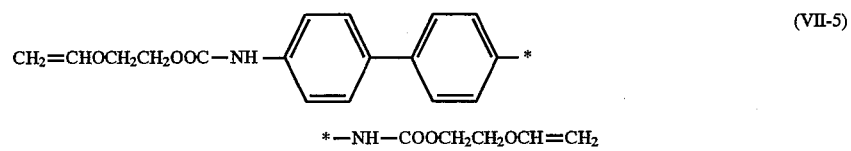
(VII-5)

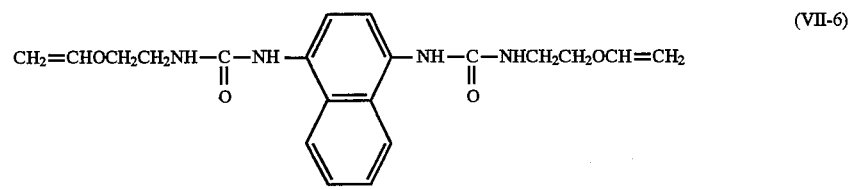
(VII-6)

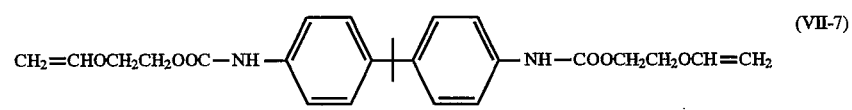
(VII-7)

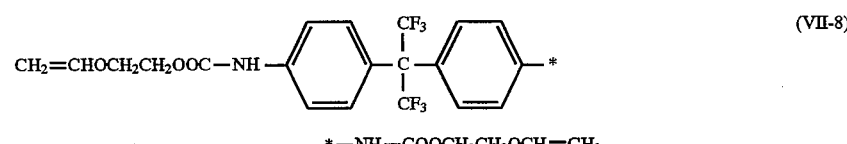
(VII-8)

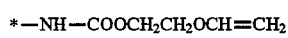

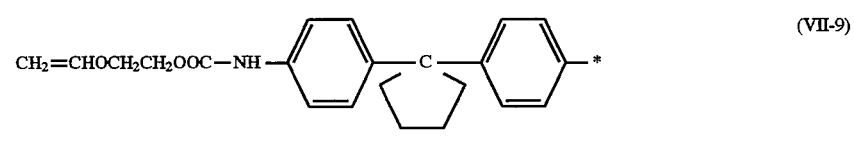
(VII-9)

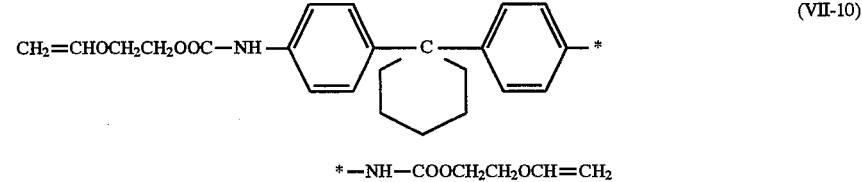
(VII-10)

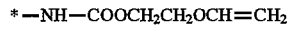

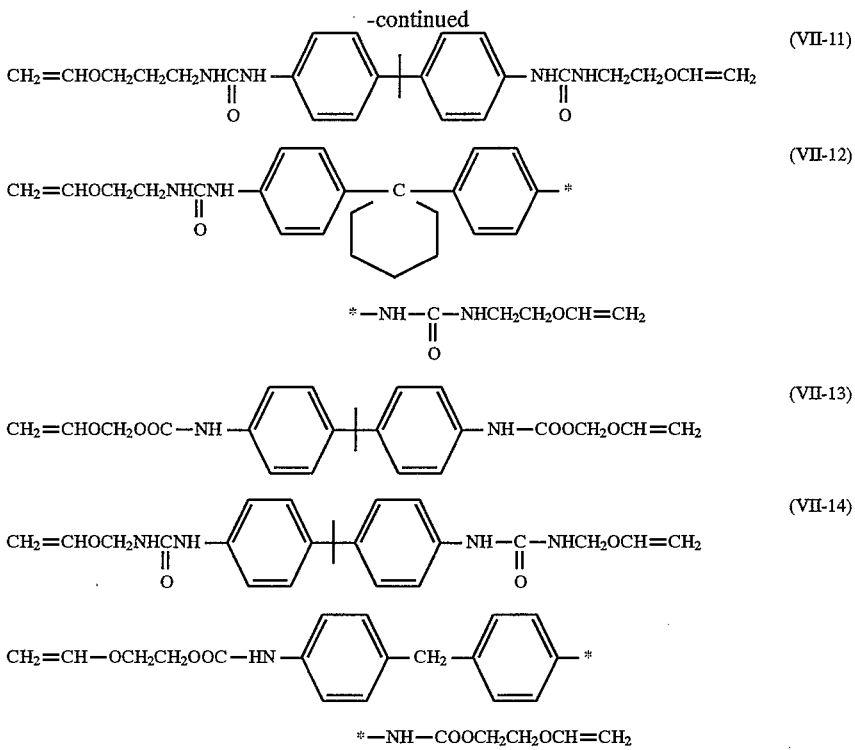

The above-described compounds containing at least two enol ether groups in a molecule can be used alone, but they may be used as a mixture of several of different types.

The proportion of the enol ether group-containing compound(s) in a photosensitive composition is generally from 1 to 80 weight %, preferably from 5 to 50 weight %, on a solids basis.

When the proportion of the foregoing compound(s) is within the range specified above, in the case of the negative image formation, the cationic polymerization can efficiently proceed to provide a patterned coating film of high strength; while, in the case of the positive image formation, the coating film can have sufficiently high strength in the unexposed area through the thermo-crosslinking upon formation of the coating film.

Further, an acid precursor which can be used in the present invention is illustrated below in detail.

The acid precursor used in the present invention can be appropriately selected from photoinitiators for photocationic polymerization, photoinitiators for photoradical polymerization, photodecolorizing agents for dyes, photodiscoloring agents, known compounds capable of generating acids through pyrolysis, such as known acid generators for microresist use, or the mixtures of two or more thereof.

Specific examples of such acid precursors include the diazonium salts described in S. I. Schlesinger, *Photogra. Sci. Eng.*, 18, 387(1974), and T. S. Bal et al., *Polymer,* 21, 423(1980); the ammonium salts described in U.S. Pat. Nos. 4,069,055, 4,069,056 and Re 27,992, and JP-A-04-365049; the phosphonium salts described in D. C. Necker et al., *Macromolecules.*, 17, 2468(1984), C. S. Wen et al., *Teh. Proc. Conf. Rad. Curing ASIA,* p. 478, Tokyo, Oct. (1988), and U.S. Pat. Nos. 4,069,055 and 4,069,056; the iodonium salts described in J. V. Crivello et al., *Macromolecules.*, 10(6), 1307(1977), *Chem. & Eng. News,* Nov. 28, p. 31 (1988), European Patent 104,143, U.S. Pat. Nos. 339,049 and 410,201, JP-A-02-150848 and JP-A-02-296514; the sulfonium salts described in J. V. Crivello et al., *Polymer J.,* 17, 73(1985), J. V. Crivello et al., *J. Org. Chem.,* 43, 3055(1978), W. R. Watt et al., *J. Polymer Sci.,* Polymer Chem. Ed., 22, 1789(1984), J. V. Crivello et al., *Polymer Bull.,* 14, 279(1985), J. V. Crivello et al., *Macromolecules,* 14(5), 1141(1981), J. V. Crivello et al., *J. Polymer Sci.,* Polymer Chem. Ed., 17, 2877(1979), European Patents 370,693, 390,214, 233,567, 297,443 and 297,442, U.S. Pat. Nos. 4,933,377, 161,811, 410,201, 339,049, 4,760,013, 4,734,444 and 2,833,827, and German Patents 2,904,626, 3,604,580 and 3,604,581; the selenonium salts described in J. V. Crivello et al., *Macromolecules,* 10(6), 1307(1977), and J. V. Crivello et al., *J. Polymer Sci.,* Polymer Chem. Ed., 17, 1047(1979); the onium salts, including arsonium salts, described in C. S. Wen et al., *Teh. Proc. Conf. Rad. Curing ASIA,* p. 478, Tokyo, Oct. (1988); the organic halogenated compounds described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; the organometallic/organic halogenated compounds described in K. Meier et al., *J. Rad. Curing,* 13(4), 26(1986), T. P. Gill et al., *Inorg. Chem.,* 19, 3007(1980), D. Astruc, *Acc. Chem. Res.,* 19(12), 377(1986), and JP-A-02-161445; the photoacid generators having the protective groups of an o-nitrobenzyl type as described in S. Hayase et al., *J. Polymer Sci.,* 25, 753(1987), E. Reichmanis et al., *J. Polymer Sci.,* Polymer Chem. Ed., 23, 1(1985), Q. Q. Zhu et al., *J. Photochem.,* 36, 85, 39, 317(1987), B. Amit et al., *Tetrahedron Lett.,* (24) 2205(1973), D. H. R. Barton et al., *J. Chem. Soc.,* 3571(1965), P. M. Collins et al., *J. Chem. Soc.,* Perkin I, 1695(1975), M. Rudinstein et al., *Tetrahedron Lett.,* (17), 1445(1975), J. W. Walker et al., *J. Am. Chem. Soc.,* 110, 7170(1988), S. C. Busman et al., *J. Imaging Technol.,* 11(4), 191(1985), H. M. Houlihan et al., *Macromolecules,* 21, 2001(1988), P. M. Collins et al., *J. Chem. Soc., Chem. Commun.,* 532(1972), S. Hayase et al., *Macromolecules,* 18, 1799(1985), E. Reichmanis et al., *J. Electrochem. Soc.,* Solid State Sci. Technol. 130(6), F. M. Houlihan et al., *Macromolecules,* 21, 2001(1988), European Patents 0,290,750, 046,083, 156,535, 271,851 and 0,388, 343, U.S. Pat. Nos. 3,901,710 and 4,181,531, JP-A-60-198538 and JP-A-53-133022; the compounds capable of producing sulfonic acids through photolysis, represented by iminosulfonates, as described in M. Tunooka et al., *Polymer Preprints Japan*, 38(8), G. Berner et al., *J. Rad. Curing*, 13(4), W. J. Mijs et al., *Coating Technol.*, 55(697), 45(1983), Akzo, H. Adachi et al., *Polymer Preprints Japan.*, 37(3), European Patents 0,199,672, 084,515, 199,672, 044,115 and 0,101,122, U.S. Pat. Nos. 4,618,564, 4,371,605 and 4,431,774, JP-A-64-18143, JP-A-02-245756, and JP-A-04-365048; and the disulfone compounds described in JP-A-61-166544.

Also, polymers obtained by introducing the acid-generating salts or acid-generating compounds as cited above in their main or side chains can be used, with specific examples including the compounds described in M. E. Woodhouse et al., *J. Am. Chem. Soc.*, 104, 5586(1982), S. P. Pappas et al., *J. Imaging Sci.*, 30(5), 218(1986), S. Kondo et al., *Makromol. Chem.*, Rapid Commun., 9, 625(1988), Y. Yamada et al., *Makromol. Chem.*, 152, 153, 163 (1972), J. V. Crivello et al., *J. Polymer Sci.*, Polymer Chem. Ed., 17, 3845(1979), U.S. Pat. No. 3,849,137, German Patent 3,914,407, JP-A-63-26653, JP-A-55-164824, JP-A-62-69263, JP-A-63-146387, JP-A-63-163452, JP-A-62-153853 and JP-A-63-146029.

In addition, the compounds capable of generating acids by exposure to light as described in V. N. R. Pillai, *Synthesis.*, (1), 1(1980), A. Abad et al., *Tetrahedron Lett.*, (47), 4555 (1971), D. H. R. Barton et al., *J. Chem. Soc., (C)*, 329(1970), U.S. Pat. No. 3,779,778, European Patent 126,712 and so on can be used.

Of the aforementioned acid precursors, especially effective ones are illustrated below.

(1) Trihalomethyl-substituted oxazole derivatives represented by formula (VIII) and s-triazine derivatives represented by formula (IX):

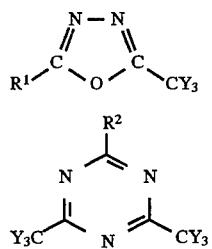

wherein $R^1$ is a substituted or unsubstituted aryl or alkenyl group; $R^2$ is a substituted or unsubstituted aryl, alkenyl or alkyl group or —$CY_3$ group (wherein Y is a chlorine or bromine atom).

As the foregoing oxazole derivative represented by formula (VIII) and s-triazine derivatives represented by formula (IX), Compounds VIII-1 to VIII-8 and Compounds IX-1 to IX-10 illustrated below, respectively. However, the compounds usable in the invention should not be construed as being limited to these examples.

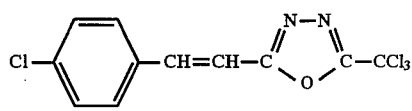

(VIII-1)

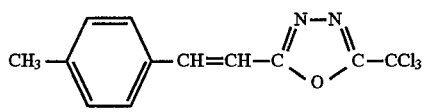

(VIII-2)

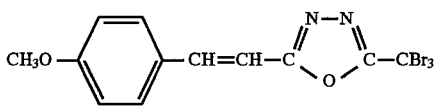

(VIII-3)

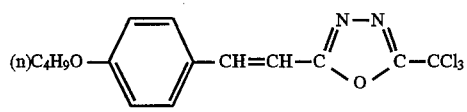

(VIII-4)

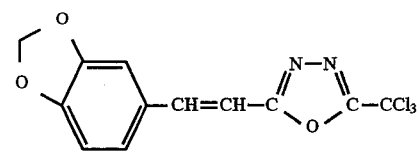

(VIII-5)

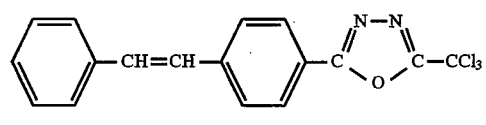

(VIII-6)

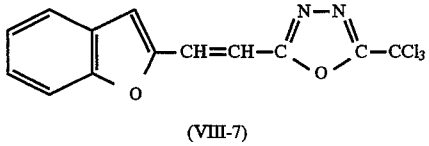

(VIII-7)

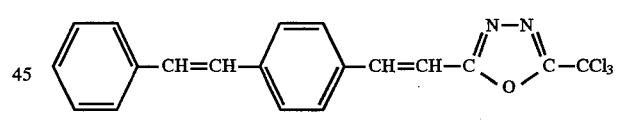

(VIII-8)

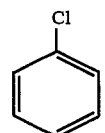

(IX-1)

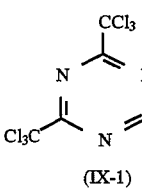

(IX-2)

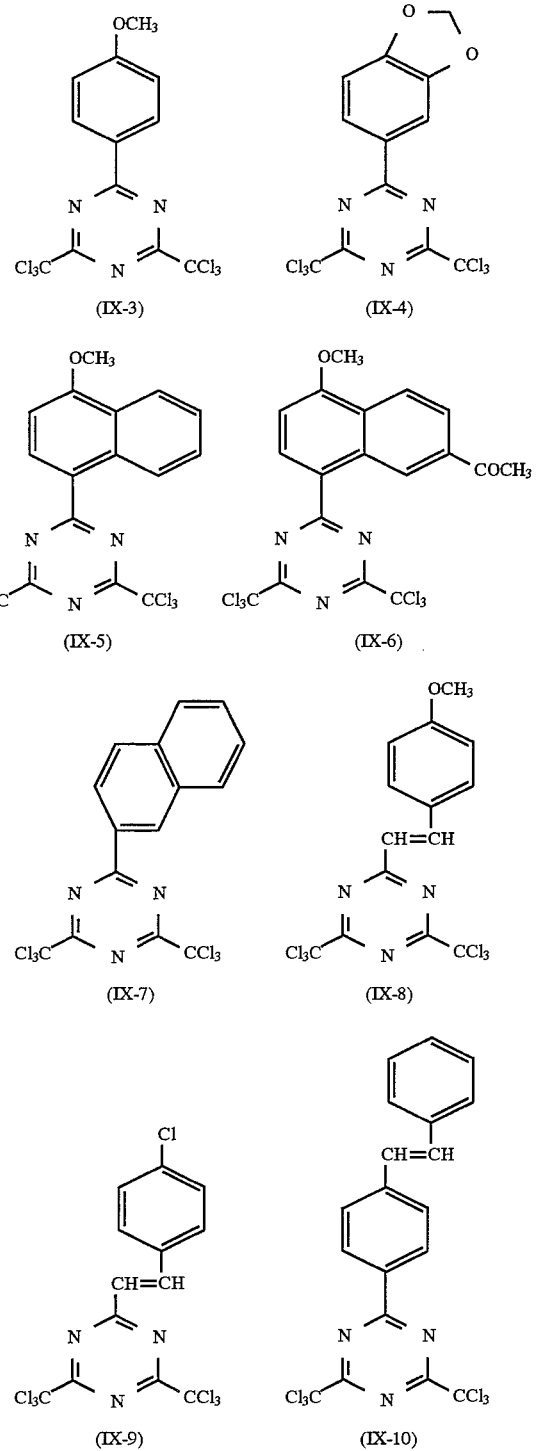

(2) Iodonium salts represented by formula (X) and sulfonium salts represented by formula (XI):

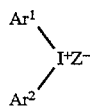

(X)

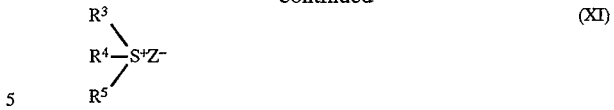

(XI)

In the foregoing formula, Ar¹ and Ar² each is a substituted or unsubstituted aryl group (preferably having 1 to 20 carbon atoms). Examples of a substituent group suitable for the aryl group include an alkyl group, a haloalkyl group, a cycloalkyl group, an aryl group, an alkoxy group, a nitro group, a carboxyl group, an alkoxycarbonyl group, a hydroxy group, a mercapto group and a halogen atom.

$R^3$, $R^4$ and $R^5$ in the above formula each represents a substituted or unsubstituted alkyl or aryl group. Preferably, each of them is an aryl group having 6 to 14 carbon atoms, an alkyl group having 1 to 8 carbon atoms, or a substituted derivative thereof. Examples of a substituent group suitable for the aryl group include an alkoxy group having 1 to 8 carbon atoms, an alkyl group having 1 to 8 carbon atoms, a nitro group, a carboxyl group, a hydroxy group and a halogen atom; Examples of a substituent group suitable for the alkyl group include an alkoxy group having 1 to 8 carbon atoms, a carboxyl group and an alkoxycarbonyl group.

$Z^-$ in the foregoing formulae represents a counter anion, with examples including $BF_4^-$, $AsF_6^-$, $PF_6^-$, $SbF_6^-$, $SiF_6^-$, $ClO_4^-$, $CF_3SO_3^-$, $BPh_4^-$ (Ph= phenyl), condensed polynuclear aromatic sulfonic acid anion such as naphthalene-1-sulfonic acid anion, etc., anthraquinonesulfonic acid anion, sulfonic acid group-containing dyes, and so on. However, those usable in the invention should not be construed as being limited to those anions.

Further, any two among $R^3$, $R^4$ and $R^5$ in formula (X) and Ar¹ and Ar² in formula (XI) respectively may be combined with each other via a single bond or substituent group.

The onium salts represented by formulae (X) and (XI) respectively are well-known, and can be synthesized according to the methods described, e.g., in J. W. Knapczyk et al., *J. Am. Chem. Soc.*, 91, 145(1969), A. L. Maycok et al., *J. Org. Chem.*, 35, 2532(1970), E. Goethas et al., *Bull. Soc. Chem. Belg.*, 73, 546(1964), H. M. Leicester, *J. Am. Chem. Soc.*, 51, 3587(1929), J. V. Crivello et al., *J. Polymer Sci.*, Polymer Chem. Ed., 18, 2677(1980), U.S. Pat. Nos. 2,807,648 and 4,247,473, and JP-A-53-101331.

Specific examples of the onium compounds of formulae (X) and (XI) include Compounds X-1 to X-22 and Compounds XI-1 to XI-34 as illustrated below. However, onium compounds usable in the invention should not be construed as being limited to these compounds.

(X-1)

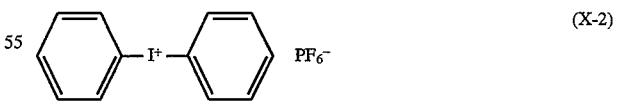

(X-2)

(X-3)

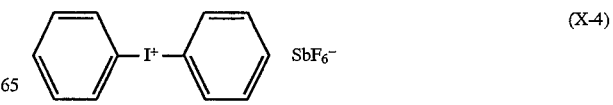

(X-4)

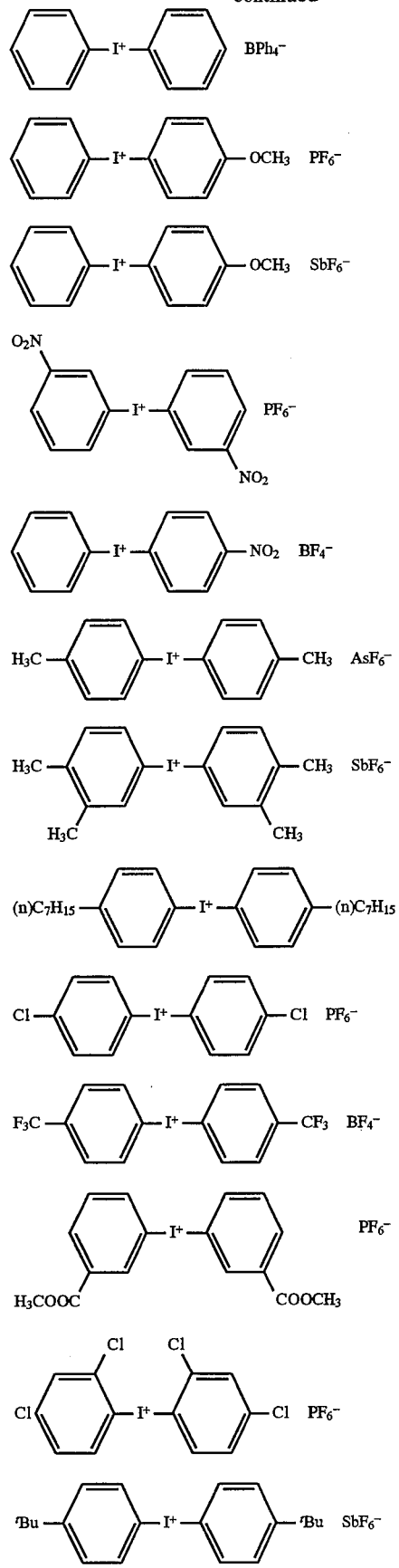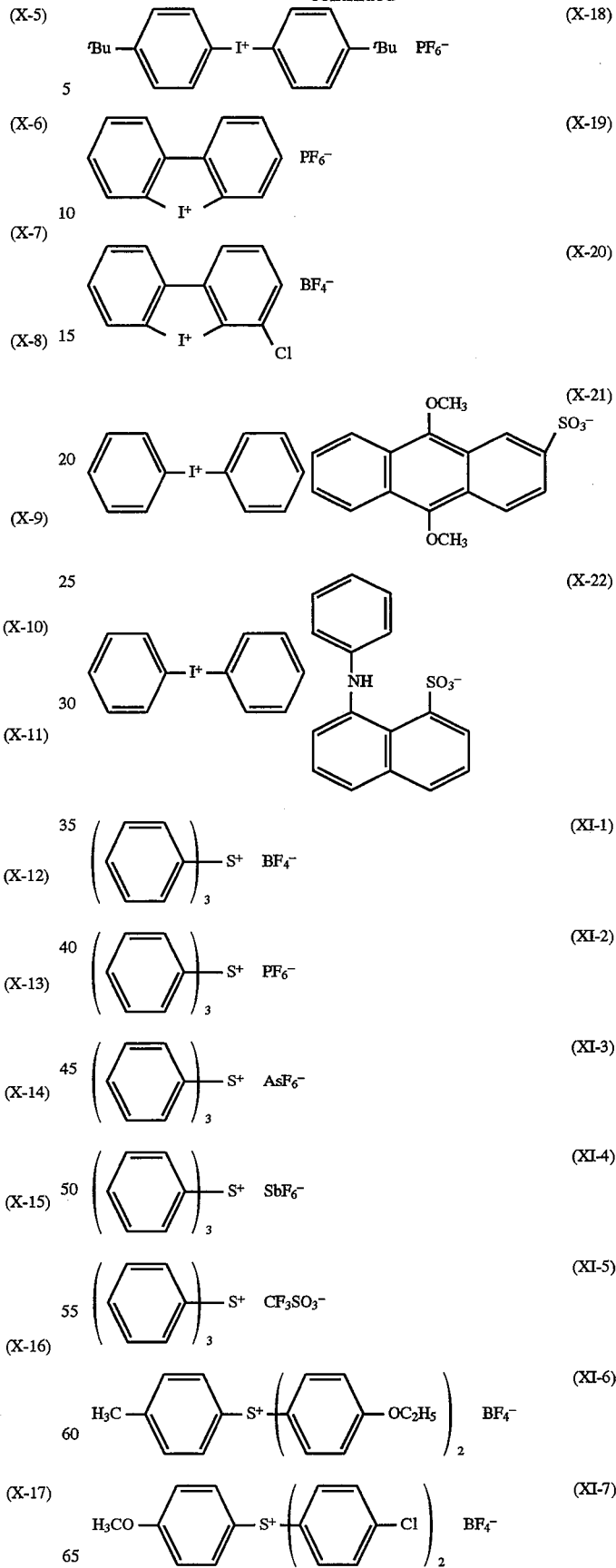

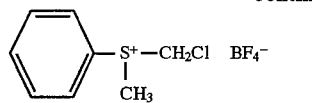 (XI-9)
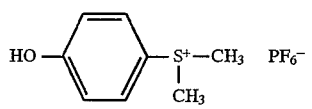 (XI-9)
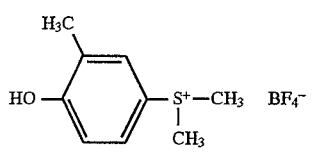 (XI-10)
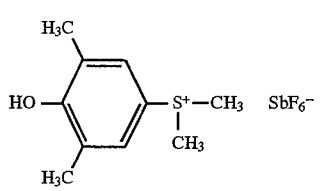 (XI-11)
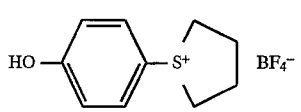 (XI-12)
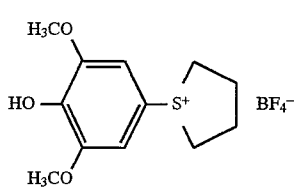 (XI-13)
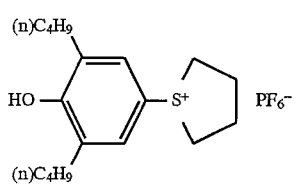 (XI-14)
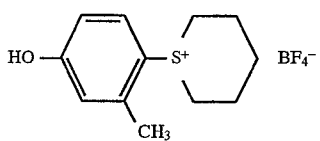 (XI-15)
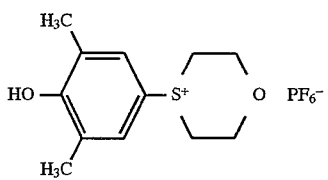 (XI-16)
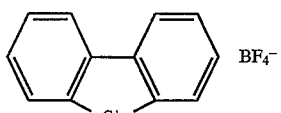 (XI-17)
 (XI-18)
 (XI-19)
 (XI-20)
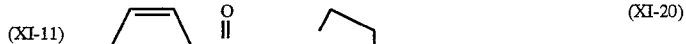 (XI-21)
 (XI-22)
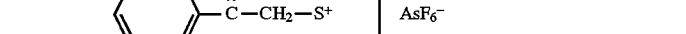 (XI-23)
 (XI-24)
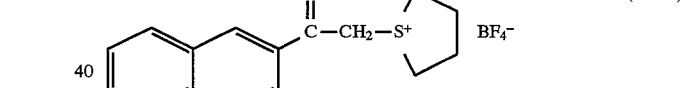 (XI-25)
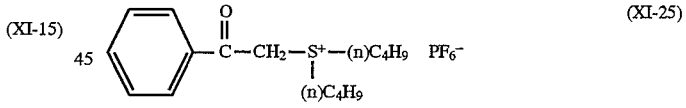 (XI-26)
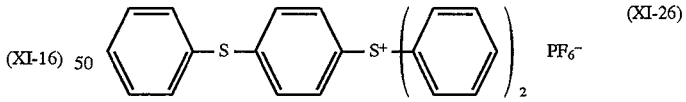 (XI-27)
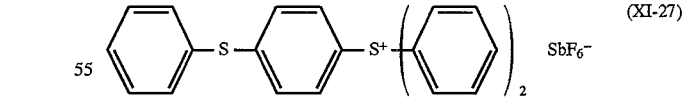 (XI-28)
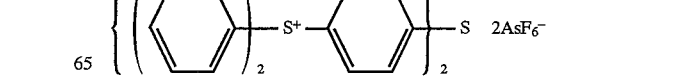 (XI-29)

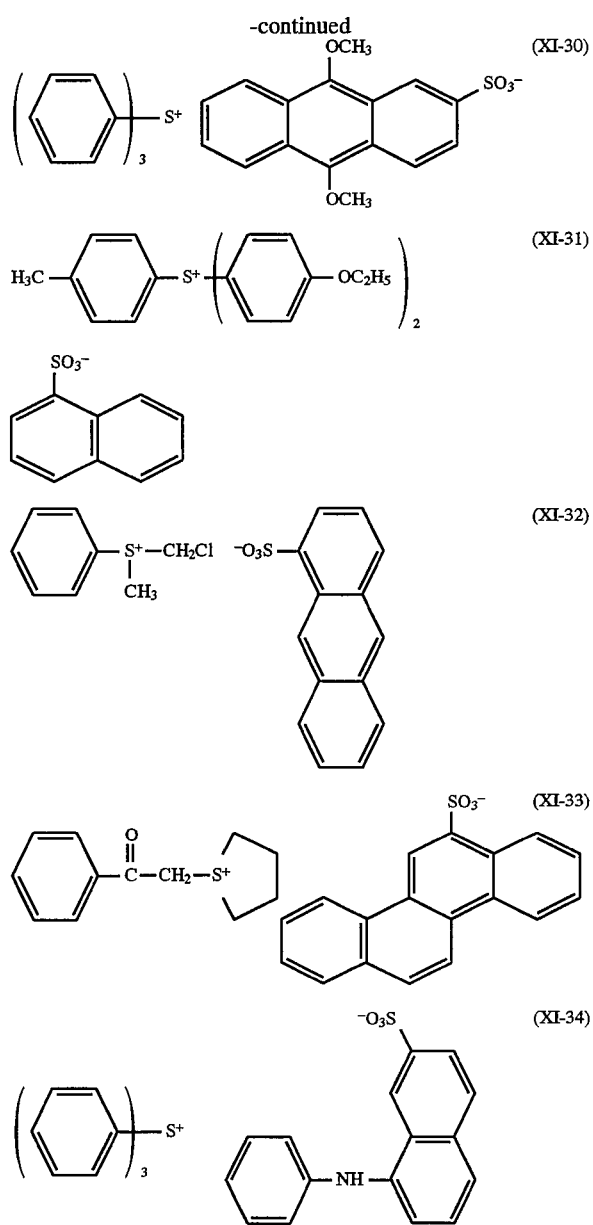

(3) Disulfone derivatives represented by formula (XII) and iminosulfonate derivatives represented by formula (XIII):

$$Ar^3-SO_2-SO_2-Ar^4 \quad (XII)$$

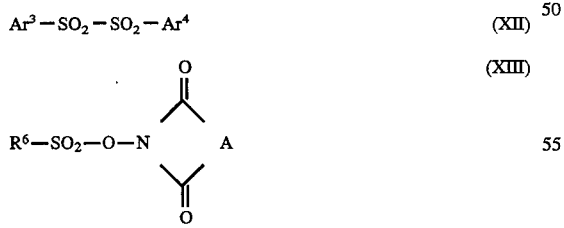

wherein $Ar^3$ and $Ar^4$ each is a substituted or unsubstituted aryl group (preferably having 4 to 20 carbon atoms), $R^6$ is a substituted or unsubstituted alkyl group (preferably having 1 to 20 carbon atoms) or aryl group, and A is a substituted or unsubstituted alkylene group, alkenylene group (preferably having 1 to 20 carbon atoms) or arylene group (preferably having 4 to 20 carbon atoms).

Specific examples of the compounds represented by formulae (XII) and (XIII) include Compounds XII-1 to XII-12 and Compounds XIII-1 to XIII-12 as illustrated below. However, the foregoing types of compounds which can be used in the invention should not be construed as being limited to these compounds.

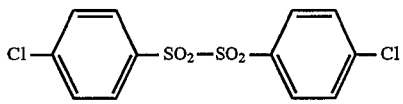

(XII-1)

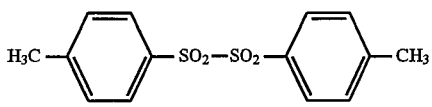

(XII-2)

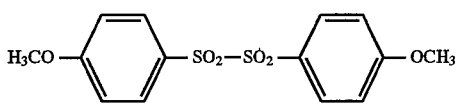

(XII-3)

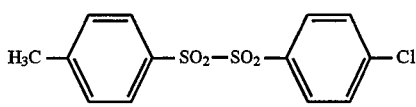

(XII-4)

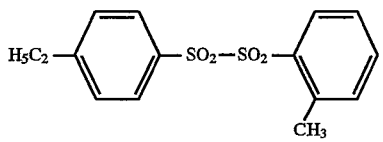

(XII-5)

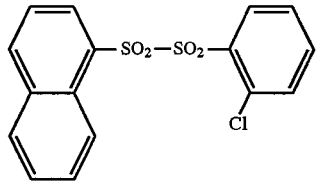

(XII-6)

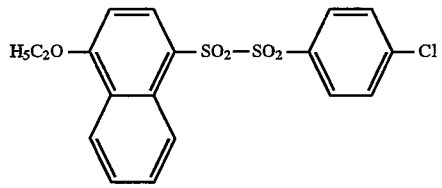

(XII-7)

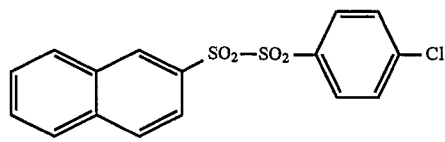

(XII-8)

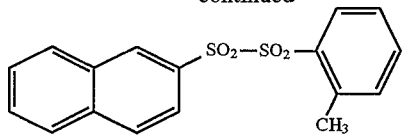
(XII-9)
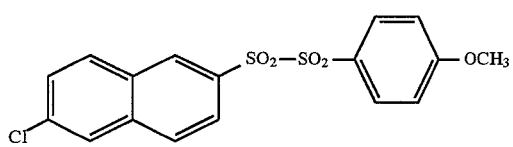
(XII-10)
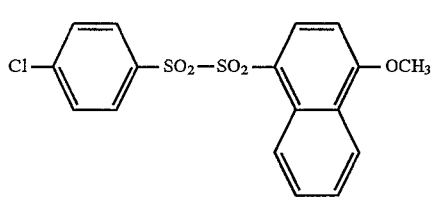
(XII-11)
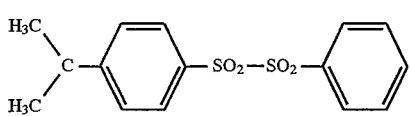
(XII-12)
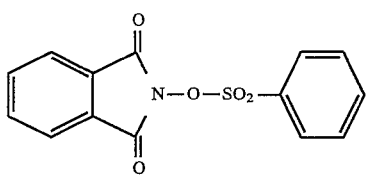
(XIII-1)
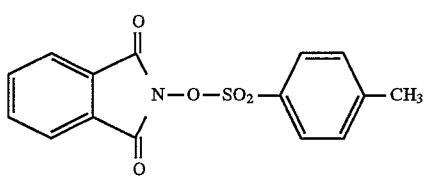
(XIII-2)
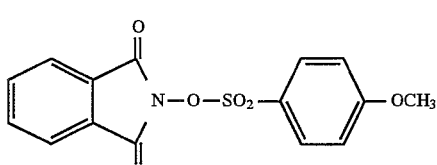
(XIII-3)
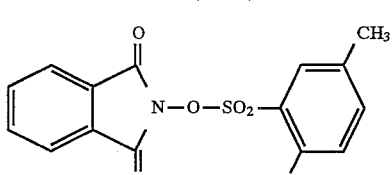
(XIII-4)
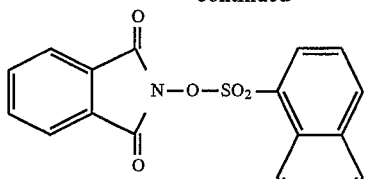
(XIII-5)
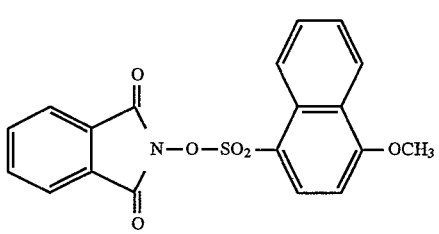
(XIII-6)
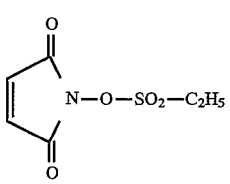
(XIII-7)
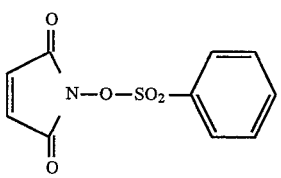
(XIII-8)
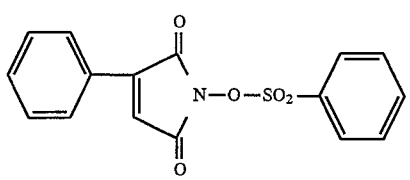
(XIII-9)
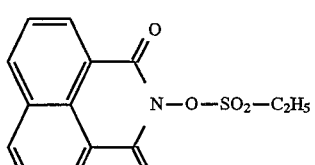
(XIII-10)
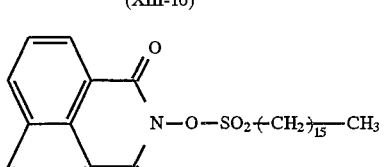
(XIII-11)

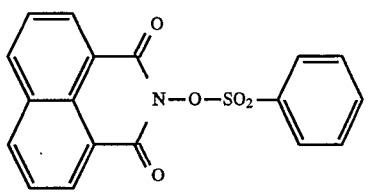

(XIII-12)

Those compounds, which are decomposed by irradiation of radiant ray to generate acids, are added in a proportion of generally from 0.001 to 40 weight %, preferably from 0.1 to 20 weight %, based on the total solid components in the photosensitive composition.

The alkali-soluble resins used in the present invention are linear organic polymers, and can be arbitrarily selected from polymers compatible with photopolymerizable vinyl ether compounds.

The alkali-soluble resins which can be appropriately used for preparing a negative working image-recording material include addition polymers having carboxylic acid groups in their side chains, such as those described in JP-A-59-44615, JP-B-54-34327, JP-B-58-12577, JP-B-54-25957, JP-A-54-92723, JP-A-59-53836 and JP-A-59-71048, for example, methacrylic acid copolymers, acrylic acid copolymers, itaconic acid copolymers, crotonic acid copolymers, maleic acid copolymers, partially esterified maleic acid copolymers and the like. Also, acidic cellulose derivatives having carboxylic acid groups in their side chains are included in the alkali-soluble resins used for the above-described purpose. Besides the above-described polymers, the products obtained by the addition of cyclic acid anhydrides to the addition polymers having hydroxyl groups are useful. In particular, among these, the copolymers of benzyl(meth)acrylate, (meth)acrylic acid and, if desired, another addition polymerizable vinyl monomer, and the copolymers of allyl (meth)acrylate, (meth)acrylic acid and, if desired, another addition polymerizable vinyl monomer are preferred. Further, water-soluble linear organic polymers, such as polyvinyl pyrrolidone, polyethylene oxides, etc., are effectively used. For the purpose of heightening the strength of a cured coating film, on the other hand, alcohol-soluble nylon and the polyethers prepared from 2,2-bis-(4-hydroxyphenyl)-propane and epichlorohydrin can be used effectively. These linear organic polymers which are used for preparing negative working image-recording material can be mixed in an arbitrary proportion with other ingredients of the photosensitive composition. When they are used in a proportion greater than 90 weight %, however, those polymers cannot produce a desirable result, e.g., with respect to the strength of images formed. The proportion appropriate for those polymers is preferably from 30 to 85 weight %. The ratio of photopolymerizable vinyl ether compounds to linear organic polymers is in the range of preferably from ⅑ to ⅔ by weight, more preferably, from 3/7 to 5/5 by weight.

The alkali-soluble resins which can be appropriately used for preparing a positive working image-recording material, in which an acid precursor is present, are linear polymers having acid groups capable of thermally reacting with enol ether compounds to form resins cross-linked in three dimensions. The linear polymers having acid groups are described below in detail.

Acid group-containing linear polymers used as alkali-soluble resins in the present invention can be arbitrarily selected from those capable of thermally crosslinking with compounds containing at least two enol ether groups to form the cross-linked parts decomposable efficiently by an acid.

The linear polymers of the above-described type can be synthesized using well-known methods for general linear polymers. For instance, such the polymer can be obtained by copolymerizing a vinyl monomer containing an acid group, preferably a carboxylic acid group, a sulfonic acid group, a phosphoric acid group, a sulfonamido group or the like, and another copolymerizable vinyl monomer.

Examples of an acid group-containing vinyl monomer which can be used include acrylic acid, methacrylic acid, maleic acid, itaconic acid, crotonic acid, isocrotonic acid, p-vinylbenzoic acid, p-vinylbenzenesulfonic acid, p-vinylsuccinic acid, maleic acid monomethyl ether, maleic acid monoethyl ether and so on, but the monomers usable in the present invention should not be construed as being limited to the above-cited acids.

Examples of a monomer copolymerizable with the foregoing monomers include acrylonitrile, acryloamide, methacrylamide, methylacrylate, ethylacrylate, propylacrylate, butylacrylate, benzylacrylate, methylmethacrylate, ethylmethacrylate, propylmethacrylate, butylmethacrylate, benzylmethacrylate, vinyl benzoate, vinyl chloride, vinylidene chloride, styrene, vinyl acetate, N-(4-sulfamoylphenyl)methacrylamide, N-phenylphosphonyl-methacrylamide, butadiene, chloroprene, isoprene, 2-hydroxyethylstyrene, 2-hydroxyethylacrylate, 2-hydroxyethylmethacrylate, p-2-hydroxyethylstyrene, p-hydroxystyrene, 3-mercaptoethylacrylate, 2-mercaptoethylmethacrylate and so on, but the copolymerizable monomers which can be used in the present invention should not be construed as being limited to the above-cited ones.

In copolymerizing acid group-containing vinyl monomers and other copolymerizable monomers, any combination of monomers and any number of monomers may be used. A ratio of the acid group-containing monomers to the copolymerizable monomers is in the range of generally 2–80:90–20, preferably 5–70:95–30, and particularly preferably 5–30:95–70.

Also, the acid group-containing linear polymers can be obtained by the co-condensation of an acid group-containing dihydroxy compound and a dicarboxylic acid compound.

For instance, carboxyl group-containing linear polyurethane resins can be obtained by reacting in equimolar amounts a dihydroxy compound, such as 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid, tartaric acid, etc., with a diisocyanate compound, such as 2,4-tolylenediisocyanate, 2,4-tolylenediisocyanate dimer, 4,4'-diphenylmethanediisocyanate, 1,5-naphthylenediisocyante, hexamethylenediisocyante, trimethylhexamethylenediisocyanate, 4,4'-methylenebis (cyclohexylisocyanate), etc. In the aforementioned co-condensation, diol compounds which have no carboxyl group but optionally have a substituent group unreactive to isocyanate group may further be used. Examples of such the diol compound include ethylene glycol, diethylene glycol, triethylene glycol, neopentyl glycol, 1,3-butylene glycol, bisphenol A, hydrogenated bisphenol A, hydrogenated bisphenol F, and ethylene oxide adduct of bisphenol A, and the like. However, the diols which can be used in the present invention should not be construed as being limited to the above-cited compounds.

In addition, the linear polymers can be obtained by the co-condensation of an acid group-containing diol as described above, another diol as described above, if desired, and a difunctional carboxylic acid such as phthalic acid, isophthalic acid, terephthalic acid, fumaric acid, itaconic acid, adipic acid or the like.

A ratio of the acid group-containing diols to other monomer units is in the range of generally 2–80:98–20, preferably 5–70:95–30, and particularly preferably 5–30:95–70.

As the linear polymer having both acid and hydroxyl groups, a resin having phenolic hydroxyl groups can be used in the present invention. Specific examples of such the resin include novolak resins, e.g., a phenol-formaldehyde resin, a m-cresol-formaldehyde resin, a p-cresol-formaldehyde resin, an o-cresol-formaldehyde resin, a m-/p-mixed cresol-formaldehyde resin, a phenol/cresol-formaldehyde resin and so on; resol type phenol resins; phenol-modified xylene resins; polyhydroxystyrene and poly(halogenated hydroxystyrene); acrylic resins having phenolic hydroxy groups; and so on. Additionally, the resins of the foregoing type which can be used in the present invention should not be construed as being limited to the above-cited ones.

It is preferred that those linear polymers have a molecular weight ranging from 1,000 to 1,000,000, more preferably from 1,500 to 200,000, and most preferably from 2,000 to 100,000.

Of those linear polymers, the copolymers comprising acid group-containing monomers and hydroxyl group-containing monomers in proportions specified below are favored over the others. That is, the proportion of the acid group-containing monomers in the copolymer is generally from 5 to 50 weight %, preferably from 5 to 40 weight %, and more preferably from 10 to 30 weight %; while the proportion of the hydroxyl group-containing monomers is generally from 5 to 50 weight %, preferably from 5 to 40 weight %, and more preferably from 10 to 30 weight %.

Those linear polymers used for preparing a positive or negative working image-recording material can be used alone, but they may be used as a mixture of several thereof. The linear polymer(s) can be added to a photosensitive composition in a proportion of generally 1 to 95 weight %, preferably 20 to 90 weight %, more preferably 30 to 80 weight %, based on the total solid components in the photosensitive composition.

When the proportion of linear polymer(s) is in the aforementioned range, satisfactory positive or negative images can be formed.

The image recording materials according to the present invention are dissolved or dispersed in a solvent which can dissolve or disperse the ingredients as illustrated above, and applied to a support. Specific examples of a solvent used therein include methanol, ethanol, isopropyl alcohol, n-butyl alcohol, t-butyl alcohol, ethylene dichloride, cyclohexanone, acetone, methyl ethyl ketone, ethylen, glycol, ethylene glycol monomethyl ether, ethylene glycol monoethyl ether, 2-methoxyethylacetate, 1-methoxy-2-propanol, 1-methoxy-2-propylacetate, N,N-dimethylformamide, tetrahydrofuran, dioxane, dimethylsulfoxide, ethyl acetate, methyl lactate, ethyl lactate, y-butyrolactone and so on. These solvents are used alone, or as a mixture of two or more thereof.

To such the single or mixed solvent as described above, it is preferred to further add a small amount of water, toluene or like solvent which cannot dissolve a diazo resin or other polymers.

Additionally, the concentration of the aforementioned ingredients (total solids) in a solvent is from 1 to 50 weight %.

The solution or dispersion of the total ingredients in a solvent is applied to a support and then dried to form a coating film. In preparing a negative working image-recording material, it is desirable that the drying be carried out at a temperature of from 50° to 100° C. In preparing a positive working image-recording material, on the other hand, a suitable temperature for the drying is from 100° to 150° C.

To an image-recording material, it is possible to add alkyl ethers (e.g., ethyl cellulose, methyl cellulose) and surfactants (e.g., fluorine-containing surfactants) for the purpose of improving coating properties, and plasticizers (e.g., tricresyl phosphate, dimethyl phthalate, dibutyl phthalate, trioctyl phosphate, tributyl phosphate, tributyl citrate, polyethylene glycol, polypropylene glycol) for the purpose of imparting softness and abrasion resistance of a coating film formed. The proportions of these additives, though depend on the addition purpose thereof, are generally from 0.5 to 30 weight % based on the total solid components in the image recording material.

As a print-out agents for obtaining visible images immediately after the absorption of radiant ray, the combination of a compound capable of releasing an acid by the heat generated upon exposure with an organic dye capable of forming a salt can be exemplified. Specific examples of such the combination include the combinations of o-naphthoquinonediazide-4-sulfonic acid halogenides with salt-forming organic dyes as described in JP-A-50-36209 and JP-A-53-8128, and the combinations of trihalomethyl compounds with salt-forming organic dyes as described in JP-A-53-36223 and JP-A-54-74728. As coloring agents for images, dyes other than the foregoing salt-forming organic dyes can also be used. As the suitable dyes, including the salt-forming organic dyes, oil-soluble dyes and basic dyes can be used. Specific examples of such the dyes include Oil Yellow #101, Oil Yellow #130, Oil Pink #312, Oil Green BG, Oil Blue BOS, Oil Blue #603, Oil Black BY, Oil Black BS, Oil Black T505 (manufactured by Orient Chemical Industry Co., Ltd.), Victoria Pure Blue, Crystal Violet (CI42555), Methyl Violet (CI42535), Rhodamine B (CI45170B), Malachite Green (CI42000), Methylene Blue (CI52015) and so on.

Those print-out agents and dyes can be used in a proportion of 0 to 30 weight % in the image recording material.

However, it becomes unnecessary to add such the agents and dyes if the radiant ray-absorbing material used can provide a visible image having sufficiently high density.

The coating amount of a coat formed, though it depends on the intended use of the coat, is desirably from 0.5 to 3.0 g/m$^2$ on a solids basis, e.g., in the case of a photosensitive planographic printing plate (or a heat-sensitive planographic printing plate). The photosensitivity becomes higher but the physical properties of the photosensitive coating film are deteriorated with a decrease in coating amount. In addition, if desired, a matt (layer) may be provided on a photosensitive coating film.

Suitable examples of a support coated with the image recording material of the present invention include paper, plastic-laminated paper (e.g., paper laminated with polyethylene, polypropylene, polystyrene or the like), sheets of metals such as aluminum (including aluminum alloys), zinc, copper, etc., films of plastics such as cellulose diacetate, cellulose triacetate, cellulose propionate, cellulose acetate, cellulose acetate butyrate, cellulose butyrate, polyethylene terephthalate, polyethylene, polystyrene, polypropylene, polycarbonate, polyvinyl acetal, etc., and paper or a plastic film laminated or evaporated with a metal as described above. Of these supports, a polyester film or an aluminum sheet is preferably used. In particular, an aluminum sheet is preferred because of its high dimensional stability. Also, it is preferable to use the composite sheet as described in JP-B-48-18327, wherein a polyethylene terephthalate film and an aluminum sheet are united into one sheet.

In the case of a support having a metal surface, particularly an aluminum surface, it is desirable that the water wettability be imparted on the support surface by an appropriate treatment.

More specifically, it is desirable that a sturdy coating film in passive state be formed on an aluminum surface by graining the surface using a mechanical method, such as wire brush graining, the method of roughening the surface with a nylon brush as a slurry of abrasive grains is poured thereonto, ball graining, etc., a chemical method using HF and $AlCl_3$, HCl or the like as an etchant, an electrochemical method using nitric acid or hydrochloric acid as an electrolytic solution, or a combination of two or more of the aforementioned surface-roughening methods; then etching the surface with an acid or alkali, if desired; and further anodically oxidizing the surface in sulfuric acid, phosphoric acid, oxalic acid, boric acid, chromic acid, sulfaminic acid or a mixture of two or more thereof as a direct or alternating electric current is passed therethrough. Although the thus formed passive-sate coating film itself has water wettability, it is preferable for the coating film to undergo a further treatment for enhancing water wettability, such as the treatment with a silicate (e.g., sodium silicate, potassium silicate) as described in U.S. Pat. Nos. 2,714,066 and 3,181,461, the treatment with potassium fluorozirconate as described in U.S. Pat. No. 2,946,638, the treatment with phosphomolybdate as described in U.S. Pat. No. 3,210,247, the treatment with an alkyltitanate as described in British Patent 1,108,559, the treatment with polyacrylic acid as described in German Patent 1,095,433, the treatment with a polyvinylphosphonic acid as described in German Patent 1,134,093 and British Patent 1,230,447, the treatment with a phosphonic acid as described in JP-B-44-6409, the treatment with phytic acid as described in U.S. Pat. No. 3,307,951, or the complex treatment with a hydrophilic organic polymer and a divalent metal as described in JP-A-58-16893 and JP-A-58-18291; or to have thereon an undercoating film of water-soluble polymer having sulfonic acid groups as described in JP-A-59-101651, thereby acquiring higher water wettability. In addition, the electrodeposition of silicate as described in U.S. Pat. No. 3,658,662 can be adopted in order to further heighten water wettability of the passive-state coating film.

Examples of a light source of active rays used for imagewise exposure include a mercury lamp, a metal halide lamp, a xenon lamp, a chemical lamp, a carbon arc lamp and so on. As the radiant rays, electron beams, X-rays, ion beams and far infrared rays are exemplified. Also, g-line, i-line, deep UV rays and high density energy beams (laser beams) can be employed. Specific examples of laser beams include helium-neon laser, argon laser, krypton laser, helium-cadmium laser, KrF excimer laser and so on. In the present invention, light sources having emission wavelengths of from near infrared region to infrared region are preferred. Especially a solid laser device and a semiconductor laser device are preferred.

As examples of a developer and a replenisher which can be used for the image recording material of the present invention, the conventional alkaline aqueous solutions can be used. Suitable examples of an alkali agent used therein include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, lithium hydroxide and so on; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediimine, pyridine and so on.

These alkali agents can be used alone or in combination of two or more thereof.

To each of the developer and replenisher, various surfactants and organic solvents can be added for the purposes of accelerating or inhibiting the developability, dispersing the developer scum and heightening the ink receptivity in the image area of a printing plate. Examples of a surfactant which can be added include anionic, cationic, nonionic and amphoteric surfactants.

To each of the developer and replenisher can further be added, if desired, a reducing agent, e.g., hydroquinone, resorcinol, sodium and potassium salts of inorganic acids such as sulfurous acid, hydrosulfurous acid, etc., an organic carboxylic acid, a defoaming agent and a hard-water softener.

Of the developers as described above, those preferred in particular, include the developers described in JP-A-54-62004 and JP-B-57-7427; the developer composition described in JP-A-51-77401, which comprises benzyl alcohol, an anionic surfactant, an alkali agent and water; the developer composition described in JP-A-53-44202, which is an aqueous solution comprising benzyl alcohol, an anionic surfactant and a water-soluble sulfite; and the developer composition described in JP-A-55-155355, which comprises an organic solvent whose solubility in water is not higher than 10 weight % at ordinary temperature, an alkali agent and water.

After the development-processing with the aforementioned developer and replenisher, when the image recording material of the present invention is used for a printing plate, it is desirable that the recording material be subjected to an after-processing with, e.g., wash water, a rinsing solution comprising a surfactant, a desensitizing solution containing gum arabic or a starch derivative, and so on. These solutions can be used in various combinations for the after-processing.

In order to rationalize and standardize prepress processing operations in the platemaking and graphic arts industry, an automatic processor for printing plates is widely used. Such an automatic processor is, in general, constituted of a developing part and an after-processing part. More specifically, the processor is constructed of an apparatus for conveying printing plates, processing solution tanks and devices for spraying processing solutions. Therein, the processing solutions pumped up are sprayed one after another onto the exposed printing plate from their respective spray nozzles as the plate is being conveyed horizontally, thereby effecting the development-processing. In recent years, on the other hand, it has been known to adopt the processing method in which processing tanks are filled with their respective processing solutions and a printing plate is processed by being conveyed into one tank after another by means of submerged guide rolls or the like and dipped in the processing solutions in succession. In such the automatic processing, each processing solution is replenished with each replenisher depending on the processing amount, the working time and so on.

In addition to the automatic system of processing, the so-called throwaway system of processing, wherein the processing is carried out with substantially unused processing solutions, can be employed.

When an unnecessary image area (e.g., the area corresponding to the film edge of an original film) is present in the planographic printing plate obtained by subjecting the sensitive planographic printing plate using the present image recording material to successive image-wise exposure, development, and wash and/or rinse and/or gumming operations, the deletion thereof is carried out. For instance, the deletion fluid as described in JP-B-02-13293 is applied to the unnecessary image area, allowed to stand for a prescribed time as it is, and then washed with water, thereby effecting the deletion.

The thus obtained planographic printing plate is optionally coated with a gum solution for desensitization, and then submitted to a printing operation.

The present invention will now be illustrated in more detail by reference to the following examples, but the invention should not be construed as being limited to these examples.

EXAMPLE I-1

Preparation of Substrate

A substrate was prepared using the method disclosed in JP-A-56-28893. More specifically, the surface of a 0.24 mm-thick aluminum sheet was grained with a nylon brush and an aqueous suspension of 400 mesh pumice, and thoroughly washed with water. Then, the sheet was etched by dipping for 60 seconds in a 10% aqueous solution of sodium hydroxide kept at 70° C., washed with running water, and further rinsed with a 20% aqueous $HNO_3$ for neutralization, followed by washing with water. Subsequently thereto, the sheet underwent an electrolytic surface-roughening treatment using sine wave alternating current in an electricity quantity of 160 Coulomb/$dm^2$ at the anode in a 1% water solution of nitric acid under a condition that an anode potential was 12.7 V and the ratio of the electricity quantity at the cathode to that at the anode was 0.8. The surface roughness (expressed in Ra) of the thus treated sheet was measured to be 0.6 μm. Furthermore, the sheet was dismatted by being soaked in a 30% water solution of sulfuric acid at 55° C. for 2 minutes. Thereafter, the sheet was subjected to an anodic oxidation treatment using a 20% water solution of $H_2SO_4$ under a current density of 2 A/$dm^2$, thereby forming an anodically oxidized sheet having a thickness of 2.7 g/$m^2$. Thereafter, the sheet was dipped for 1 minute in a 2.5% aqueous sodium silicate solution kept at 70° C., washed with water, and then dried.

Preparation of Carbon Black Dispersion

The following proportions of ingredients are dispersed for 10 minutes with the aid of glass beads to prepare a carbon black dispersion:

| | |
|---|---|
| Carbon black | 1.0 part by weight |
| Benzylmethacrylate-methacrylic acid (72:28 by mole) copolymer (weight average molecular weight: 7 × $10^4$) | 1.6 parts by weight |
| Cyclohexanone | 1.6 parts by weight |
| Methoxypropyl acetate | 3.8 parts by weight |

Preparation of Negative Working Photosensitive Planographic Printing Plate

The aforementioned aluminum sheet was coated with the following photosensitive solution, and then dried for 2 minute at 80° C. to prepare a negative working photosensitive planographic printing plate. The dry coverage rate was 2.0 g/$m^2$.

Composition of Photosensitive Solution

| | |
|---|---|
| Carbon black dispersion described above | 10 g |
| Compound II-11 of the present invention | 3 g |
| Benzylmethacrylate/2-hydoxymethylmethacrylate/methacrylic acid (60/20/20 by mole) copolymer (weight average molecular weight: 3 × $10^4$) | 10 g |
| FC-430 (fluorine-containing surfactant, manufactured by U.S. 3M Co., Ltd.) | 0.1 g |
| Methyl ethyl ketone | 50 g |

The thus obtained negative working photosensitive planographic printing plate was exposed to YAG laser beams whose power at the plate surface was controlled to 2 W, and then processed with an automatic processor loaded with a developer, DN-3C (1:1), and a gumming solution, FN-2 (1:1), manufactured by Fuji Photo Film Co., Ltd., thereby forming a negative image. The printing was performed using the thus prepared planographic printing plate and a printing machine, Heidel SOR-KZ, thereby obtaining about 30,000 sheets of prints having good quality.

COMPARATIVE EXAMPLE I-1

A negative working photosensitive planographic printing plate was prepared in the same manner as in Example I-1, except that the carbon black dispersion in the photosensitive solution used in Example I-1 was replaced by 0.3 g of an oil-soluble dye (Victoria Pure Blue BOH). The photosensitive planographic printing plate obtained was exposed imagewise and development-processed under the same conditions as in Example I-1. As a result, however, all the photosensitive coating film was dissolved in the developer. Thus, no image was formed.

EXAMPLES I-2 TO I-4

Photosensitive planographic printing plate samples were prepared in the same manner as in Example I-1, except that 3 g of Compound II-11 used in the photosensitive solution of Example I-1 was replaced by the compounds shown in Table I-1, respectively. Under the same conditions as in Example I-1, the writing with YAG laser beams and the development-processing were carried out to form a negative image in each the planographic printing plate samples. The printing operation was performed using each of the thus obtained printing plates under the same condition as in Example I-1; as a result, prints of good quality were obtained in the number as shown in Table I-1.

TABLE I-1

| Example | Enol Ether Compound | Number of Prints |
|---|---|---|
| I-2 | Compound II-24 3 g | about 40,000 sheets |
| I-3 | Compound II-28 3 g | about 40,000 sheets |
| I-4 | Compound VII-3 3 g | about 30,000 sheets |

EXAMPLE I-5

A negative working photosensitive planographic printing plate was prepared in the same manner as in Example I-1, except that the linear polymer in the photosensitive solution used in Example I-1 was replaced by the resin having a weight average molecular weight of $1.0 \times 10^5$ shown below:

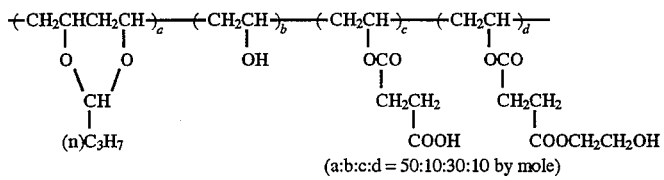

(a:b:c:d = 50:10:30:10 by mole)

The thus obtained negative working photosensitive planographic printing plate was exposed to YAG laser beams whose power at the plate surface was controlled to 2 W, and then processed with an automatic processor loaded with a developer, DN-3C (1:1), and a gumming solution, FN-2 (1:1), manufactured by Fuji Photo Film Co., Ltd., thereby forming a negative image. The printing was performed using the thus prepared planographic printing plate and a printing machine, Heidel SOR-KZ, thereby obtaining about 50,000 sheets of prints having good quality.

EXAMPLE I-6

A negative working photosensitive planographic printing plate was prepared in the same manner as in Example I-1, except that the carbon black dispersion used in Example I-1 was replaced by 0.02 g of 2,6-di-t-butyl-4-{5-(2,6-di-t-butyl-4H-thiopyran-4-ylidene)-penta-1,3-dienyl}thiopyrylium tetrafluoroborate (the compound (i.e., dye) described in U.S. Pat. No. 4,283,475).

The thus obtained photosensitive planographic printing plate was exposed by means of a semiconductor laser (wavelength: 825 nm, spot diameter: $1/e^2$=11.9 μm) controlled so as to have a line speed of 8 m/sec and a power of 110 mW at the plate surface. Then, it was subjected to the same development-processing as in Example I-1, resulting in the formation of fine lines having a line width of 10 μm.

In the next place, the photosensitive planographic printing plate was exposed under the same condition as described above, except that the beam diameter was adjusted to 6μ ($1/e^2$) and the printing plate was exposed through a 200 lpi halftone image at a writing resolution of 4000 dpi, and then processed in the same manner as the above, thereby forming a halftone image. The printing on wood free paper was performed using the thus prepared photosensitive planographic printing plate, a printing machine, Heidel SOR-KZ, made by Heidelberg AG, and commercially available ink; as a result, the printing plate was found to have a long press life similar to that of Example I-1.

COMPARATIVE EXAMPLE I-2

A negative working photosensitive planographic printing plate was prepared in the same manner as in Example I-6, except that the dye in the photosensitive solution of Example I-6 was replaced by 0.2 g of an oil-soluble dye (Victoria Pure Blue BOH). The photosensitive planographic printing plate obtained was exposed and development-processed under the same conditions as in Example I-6. As a result, however, all the photosensitive coating film was dissolved in the developer. Thus, no image was formed.

EXAMPLE II-1

A negative working photosensitive planographic printing plate was prepared in the same manner as in Example I-1, except that the photosensitive solution coated in Example I-1 was replaced by the photosensitive solution described below.

More specifically, the same aluminum sheet as used in Example I-1 was coated with the following acid precursor-containing photosensitive solution, and then subjected to 2-minute drying at 80° C. to prepare a negative working photosensitive planographic printing plate. The dry coverage rate was 2.0 g/m$^2$.

Composition of Photosensitive Solution

| | |
|---|---|
| Carbon black dispersion described hereinbefore | 10 g |
| Compound II-11 of the present invention | 3 g |
| Compound IX of the present invention | 0.3 g |
| Methylmethacrylate/acrylate/methacrylic acid (70/30 by mole) copolymer (weight average molecular weight: $3 \times 10^4$) | 10 g |
| FC-430 (fluorine-containing surfactant, manufactured by U.S. 3M Co., Ltd.) | 0.1 g |
| Methyl ethyl ketone | 50 g |

The thus obtained negative working photosensitive planographic printing plate was exposed to YAG laser beams whose power at the plate surface was controlled to 2 W, and then processed with an automatic processor loaded with a developer, DN-3C (1:1), and a gumming solution, FN-2 (1:1), manufactured by Fuji Photo Film Co., Ltd., thereby forming a negative image. The printing was performed using the thus prepared planographic printing plate and a printing machine, Heidel SOR-KZ, thereby obtaining about 30,000 sheets of prints having good quality.

COMPARATIVE EXAMPLE II-1

A negative working photosensitive planographic printing plate was prepared in the same manner as in Example II-1, except that the carbon black dispersion in the photosensitive solution of Example II-1 was replaced by 0.3 g of an oil-soluble dye (Victoria Pure Blue BOH). The photosensitive planographic printing plate obtained was exposed and development-processed under the same conditions as in Example II-1. As a result, however, all the photosensitive coating film was dissolved in the developer. Thus, no image was formed.

EXAMPLES II-2 TO II-4

Photosensitive planographic printing plate samples were prepared in the same manner as in Example II-1 except that 3 g of Compound II-11 used in the photosensitive solution of Example II-1 was replaced by the compounds shown in Table II-1, respectively. Under the same conditions as in Example II-1, the writing with YAG laser beams and the development-processing were carried out to form a negative image in each planographic printing plate samples. The printing operation was performed using each of the thus obtained printing plates under the same condition as in Example II-1; as a result, prints of good quality were obtained in the number as shown in Table II-1.

TABLE II-1

| Example | Enol Ether Compound | Number of Prints |
| --- | --- | --- |
| II-2 | Compound II-24 3 g | about 40,000 sheets |
| II-3 | Compound II-28 3 g | about 40,000 sheets |
| II-4 | Compound VII-3 3 g | about 30,000 sheets |

EXAMPLE II-5 to II-7

Photosensitive planographic printing plate samples were prepared in the same manner as in Example II-1, except that 0.3 g of Compound IX-2 used in the photosensitive solution of Example II-1 was replaced by the compounds shown in Table II-2, respectively. Under the same conditions as in Example II-1, the writing with YAG laser beams and the development-processing were carried out to form a negative image in each planographic printing plate samples. The printing operation was performed using each of the thus obtained printing plates under the same condition as in Example II-1; as a result, prints of good quality were obtained in the number as shown in Table II-2.

TABLE II-2

| Example | Acid Precursor | Number of Prints |
| --- | --- | --- |
| II-5 | Compound VIII-1 0.3 g | about 30,000 sheets |
| II-6 | Compound X-22 0.3 g | about 20,000 sheets |
| II-7 | Compound XII-8 0.3 g | about 30,000 sheets |

EXAMPLE II-8

A negative working photosensitive planographic printing plate was prepared in the same manner as in Example II-1, except that the linear polymer in the photosensitive solution of Example II-1 was replaced by the resin having a weight average molecular weight of $1.0 \times 10^5$ shown below:

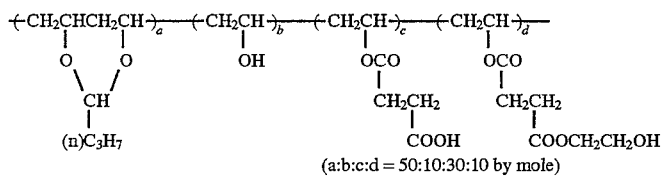

(a:b:c:d = 50:10:30:10 by mole)

The thus obtained negative working photosensitive planographic printing plate was exposed to YAG laser beams whose power at the plate surface was controlled to 2 W, and then processed with an automatic processor loaded with a developer, DN-3C (1:1), and a gumming solution, FN-2 (1:1), manufactured by Fuji Photo Film Co., Ltd., thereby forming a negative image. The printing was performed using the thus prepared photosensitive planographic printing plate and a printing machine, Heidel SOR-KZ, thereby obtaining about 50,000 sheets of prints having good quality.

EXAMPLE II-9

A negative working photosensitive planographic printing plate was prepared in the same manner as in Example II-1, except that the carbon black dispersion used in Example II-1 was replaced by 0.02 g of 2,6-di-t-butyl-4-{5-(2,6-di-t-butyl-4H-thiopyran-4-ylidene)-penta-1,3-dienyl}thiopyrylium tetrafluoroborate (the compound (i.e., dye) described in U.S. Pat. No. 4,283,475).

The thus obtained photosensitive planographic printing plate was exposed by means of a semiconductor laser (wavelength: 825 nm, spot diameter: $1/e^2 = 11.9$ μm) controlled so as to have a line speed of 8 m/sec and a power of 110 mW at the plate surface. Then, it was subjected to the same development-processing as in Example II-1, resulting in the formation of fine lines having a line width of 10 μm.

In the next place, the photosensitive planographic printing plate was exposed under the same condition as described above, except that the beam diameter was adjusted to 6μ ($1/e^2$) and the printing plate was exposed through a 200 lpi halftone image at a writing resolution of 4000 dpi, and then processed in the same manner as the above, thereby forming a halftone image. The printing on wood free paper was performed using the thus prepared photosensitive planographic printing plate, a printing machine, Heidel SOR-KZ, made by Heidelberg AG, and commercially available ink; as a result, the printing plate was found to have excellent printing properties similar to those of Example II-1.

COMPARATIVE EXAMPLE II-2

A negative working photosensitive planographic printing plate was prepared in the same manner as in Example II-9, except that the dye in the photosensitive solution of Example II-9 was replaced by 0.2 g of an oil-soluble dye (Victoria Pure Blue BOH). The photosensitive planographic printing plate obtained was exposed and development-processed under the same conditions as in Example II-9. As a result, however, all the photosensitive coating film was dissolved in the developer. Thus, no image was formed.

EXAMPLE II-10

Preparation of Positive Working Photosensitive Planographic Printing Plate

The same aluminum sheet as prepared in Example I-1 was coated with the same photosensitive solution as prepared in Example II-1, and dried at 120° C. for 10 minutes, thereby preparing a positive working photosensitive planographic printing plate. The dry coverage rate was 2.0 g/m².

The thus obtained positive working photosensitive planographic printing plate was exposed to YAG laser beams whose power at the plate surface was controlled to 2 W, and then processed with an automatic processor loaded with a developer, DN-3C (1:1), and a gumming solution, FN-2 (1:1), manufactured by Fuji Photo Film Co., Ltd., thereby forming a positive image. The printing was performed using the thus prepared planographic printing plate and a printing machine, Heidel SOR-KZ, thereby obtaining about 50,000 sheets of prints having good quality.

EFFECT OF THE INVENTION

In accordance with the present invention, it becomes possible to provide an image recording material on which images can be recorded irrespective of the wavelengths of emission from an exposure light source, and especially a negative or positive working image-recording material on which images can be recorded in the region of from near infrared ray to infrared (heat rays) ray.

Further, the present invention enables the direct plate-making from digital data of computer origin or the like by using a solid or semiconductor laser device (heat-mode), which can emit light in the range of from the near infrared region to infrared region, upon recording.

Furthermore, the present invention can provide a heat mode-writable planographic printing plate for the direct platemaking system to which conventional processors and printing apparatus can be applied as they are.

While the invention has been described in detail and with reference to specific embodiments thereof, it will be apparent to one skilled in the art that various changes and modifications can be made therein without departing from the spirit and scope thereof.

What is claimed is:

1. An image recording material comprising a radiant ray-absorbing material which generates heat upon absorption of light, a compound having at least two enol ether groups represented by formula (I) and an alkali-soluble resin:

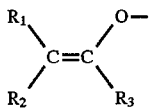

wherein $R_1$, $R_2$ and $R_3$ are the same or different, each represents a hydrogen atom, an alkyl group or an aryl group, or any two of them form a saturated or unsaturated olefinic ring by combining with each other.

2. The image recording material as claimed in claim 1, further comprising an acid precursor.

3. A coated and dried, negative-working image recording material comprising an image recording material according to claim 1, coated on a support and dried under low temperature drying conditions.

4. The image recording material as claimed in claim 1, which is a negative working image-recording material.

5. The image recording material as claimed in claim 1 wherein the radiant ray-absorbing material is a pigment capable of absorbing infrared or near infrared rays consisting of carbon black or a near infrared absorber selected from the group consisting of a substituted arylbenzo(thio) pyrylium salt, a trimethinethiapyrylium salt, a pyrylium compound, a cyanine dye, a pentamethinethiopyrylium salt, and a pyrylium compound.

* * * * *